(12) United States Patent
Matsumura et al.

(10) Patent No.: US 8,585,860 B2
(45) Date of Patent: Nov. 19, 2013

(54) BENDABLE POLYCARBONATE RESIN LAMINATE, OPTICALLY TRANSPARENT ELECTROMAGNETIC WAVE SHIELD LAMINATE, AND MANUFACTURING METHOD THEREOF

(75) Inventors: Takatoshi Matsumura, Tokyo (JP); Yoshiya Kimura, Tokyo (JP)

(73) Assignees: Mitsubishi Gas Chemical Company, Inc., Tokyo (JP); MGC Filsheet Co., Ltd., Saitama (JP)

( * ) Notice: Subject to any disclaimer, the term of this patent is extended or adjusted under 35 U.S.C. 154(b) by 316 days.

(21) Appl. No.: 12/736,818

(22) PCT Filed: May 7, 2009

(86) PCT No.: PCT/JP2009/058630
§ 371 (c)(1),
(2), (4) Date: Nov. 12, 2010

(87) PCT Pub. No.: WO2009/139318
PCT Pub. Date: Nov. 19, 2009

(65) Prior Publication Data
US 2011/0070448 A1    Mar. 24, 2011

(30) Foreign Application Priority Data

May 13, 2008  (JP) ................. 2008-125726
May 13, 2008  (JP) ................. 2008-125730

(51) Int. Cl.
*B32B 27/36* (2006.01)
*B32B 1/06* (2006.01)

(52) U.S. Cl.
USPC ............ 156/325; 156/199; 428/412

(58) Field of Classification Search
USPC ................ 156/199, 325; 428/412
See application file for complete search history.

(56) References Cited

U.S. PATENT DOCUMENTS

| | | | |
|---|---|---|---|
| 7,350,917 B2 | 4/2008 | Kawai et al. | |
| 7,781,062 B2 | 8/2010 | Kitaike et al. | |
| 2005/0124257 A1 | 6/2005 | Maeuser | |

FOREIGN PATENT DOCUMENTS

| | | |
|---|---|---|
| CN | 1620841 A | 5/2005 |
| CN | 1657975 A | 8/2005 |
| CN | 101024700 A | 8/2007 |
| EP | 0 637 510 A1 | 2/1995 |
| EP | 1 560 060 A1 | 8/2005 |
| EP | 1 582 538 A1 | 10/2005 |
| JP | 06-071833 A | 3/1994 |
| JP | 06-256723 A | 9/1994 |
| JP | 08-039746 A | 2/1996 |
| JP | 08039746 A * | 2/1996 |
| JP | 09-267459 A | 10/1997 |
| JP | 2004-315570 A | 11/2004 |
| JP | 2006-272841 A | 10/2006 |
| WO | WO 03/061348 A1 | 7/2003 |

OTHER PUBLICATIONS

International Search Report mailed Aug. 25, 2009, in PCT/JP2009/058630, 2 pages.

* cited by examiner

*Primary Examiner* — Michael Orlando
*Assistant Examiner* — Daniel Lee
(74) *Attorney, Agent, or Firm* — Foley & Lardner LLP

(57) ABSTRACT

The present invention provides a method for manufacturing a laminate, comprising the steps of laminating two or more layers of polycarbonate resin film and/or sheet using a (meth) acrylate-based adhesive composition containing a (A) (meth) acrylate monomer, a (B) meth(acrylate) olygomer, an (C) acrylamide derivative, and a (D) silane compound and/or an (E) organophosphorus compound to form a laminate having a thickness of 0.1 mm to 30 mm; heating the laminate at 130° C. to 185° C. so that a temperature difference between a top surface and a bottom surface of the laminate is within 20° C.; and bending the post-heating laminate into a curved shape having a radius of curvature of 10 mm or greater.

23 Claims, No Drawings

BENDABLE POLYCARBONATE RESIN LAMINATE, OPTICALLY TRANSPARENT ELECTROMAGNETIC WAVE SHIELD LAMINATE, AND MANUFACTURING METHOD THEREOF

CROSS-REFERENCE TO RELATED APPLICATIONS

This application is a National Stage application of PCT/JP2009/058630, filed May 7, 2009, which claims priority from Japanese applications JP 2008-125726, filed May 13, 2008, and JP 2008-125730, filed May 13, 2008.

TECHNICAL FIELD

A preferable embodiment of the present invention relates to a bendable polycarbonate resin laminate having superb transparency, adhesive force, heat resistance, and humidity resistance, and a manufacturing method thereof. In more detail, the present invention relates to a manufacturing method of a polycarbonate resin laminate, comprising the steps of laminating polycarbonate resin substrates using a (meth)acrylate-based adhesive composition containing a (A) (meth)acrylate monomer, a (B) meth(acrylate) oligomer, an (C) acrylamide derivative, and a (D) silane compound and/or an (E) organophosphorus compound to form a laminate having two or more layers; heating the laminate to a temperature of 130° C. to 185° C. (preferably 150° C. to 185° C.) while a temperature difference between a top surface and a bottom surface of the laminate is controlled to be within 20° C.; and bending the post-heating laminate into a curved shape having a radius of curvature of 10 mm or greater. The polycarbonate resin laminate according to the present invention is useful for covers or housings of industrial devices and machines, electronic devices and the like; window materials or covers of automobiles, vehicles, seacrafts, aircrafts, dwellings, hospitals, office buildings and the like; and carports, resin noise-blocking walls, security window materials, and the like used outdoors.

A preferable embodiment of the present invention relates to an optically transparent electromagnetic wave shield laminate having superb bendability and impact resistance. In more detail, the present invention relates to a manufacturing method of an optically transparent electromagnetic wave shield laminate, comprising the steps of laminating, on one or both of surfaces of an electromagnetic wave shield layer, a polycarbonate substrate (protecting layer) using a (meth)acrylate-based adhesive composition containing a (A) (meth)acrylate monomer, a (B) meth(acrylate) oligomer, an (C) acrylamide derivative, and a (D) silane compound and/or an (E) organophosphorus compound to form a laminate having two or more layers; heating the laminate to a temperature of 130° C. to 185° C. (preferably 150° C. to 185° C.) while a temperature difference between a top surface and a bottom surface of the laminate is controlled to be within 20° C.; and bending the post-heating laminate into a curved shape having a radius of curvature of 10 mm or greater. The optically transparent electromagnetic wave shield laminate according to the present invention is useful for covers or housings of industrial devices and machines, electronic devices and the like; and window materials or covers of automobiles, vehicles, seacrafts, aircrafts, dwellings, hospitals, office buildings and the like.

BACKGROUND ART

Covers and window materials for industrial devices such as semiconductor production devices, flat panel display production devices and the like; covers and window materials for industrial machines such as cranes, excavators and the like; window materials for automobiles, vehicles, seacrafts and aircrafts; and window materials for dwellings, hospitals and office buildings are conventionally formed glass. Recently, synthetic resin materials are widely used for the economic points of view of weight, fuel efficiency, and the like. Especially, polycarbonate resin laminates having superb impact resistance, heat resistance, and transparency are preferable. However, the above-listed products are used outdoors and so exposed to wind and rain or sunlight, or used under the conditions of high temperature and high humidity inside vehicles. Therefore, the polycarbonate resin laminates have problems of being clouded or peeled off due to the deterioration of the adhesive layer thereof. The above-listed products are often required to have a certain level of bendability from the viewpoints of design and safety. The polycarbonate resin laminates need to be bent at high temperature because of the high heat resistance thereof, and therefore, have problems of being warped, air-bubbled, whitened, peeled off or the like.

As an adhesive for a polycarbonate resin laminate, Patent Document 1 describes visible light-curable adhesives. A usual visible light-curable adhesive does not have a sufficient adhesive force, and so there are problems that the polycarbonate resin laminate is peeled off when being bent at high temperature, and also is air-bubbled or whitened due to the deterioration or decomposition of the adhesive layer. Under the conditions of high temperature and high humidity of outdoors or inside of a vehicle, there are problems that the polycarbonate resin laminate is clouded or peeled off. For example, the visible-light curable adhesive described in the examples of Patent Document 1 (BENEFIX PC produced by Adell Corporation) was clouded under the conditions of high temperature and high humidity (65° C.-95% RH-24 h).

As an adhesive for a polycarbonate resin laminate, Patent Document 2 describes moisture-curable hotmelt-type adhesives, thermoplastic polyester resin adhesives, and thermoplastic silane-denatured resin adhesives. However, all of these adhesives do not have a sufficient adhesive force when being heated at a temperature of 130° or higher and so have problems that the polycarbonate resin laminate is peeled off when being bent at high temperature and also is air-bubbled or whitened due to the deterioration or decomposition of the adhesive layer. Under the conditions of high temperature and high humidity of outdoors or inside of a vehicle, there are problems that the polycarbonate resin laminate is clouded or peeled off.

As an adhesive for a polycarbonate resin laminate and an acrylic-based resin laminate, Patent Document 3 describes polyurethane-based adhesive films. With such a polyurethane-based adhesive film, although a certain level of adhesive force is obtained, the polycarbonate resin laminate or the acrylic-based resin laminate is whitened at a bent portion and the visibility is significantly decreased. Under the conditions of high temperature and high humidity of outdoors or inside of a vehicle, there are problems that the polycarbonate resin laminate or the acrylic-based resin laminate is clouded or peeled off.

Meanwhile, recently, there is a serious problem that an electromagnetic wave generated from electronic devices such as personal computers, mobile phones, flat panel displays represented by liquid crystal displays and plasma displays, touch panels, car navigation systems, mobile information terminals and the like, motors of industrial machines, and the like causes malfunctions of the industrial machines and the electronic devices or communication failures. Moreover, the electromagnetic wave is indicated as possibly having an adverse influence on human bodies. In order to prevent the so-called electromagnetic interference (hereinafter, referred to as the "EMI"), measures are now taken using various electromagnetic wave shield materials.

Since a single electromagnetic wave shield material does not provide a sufficient strength, electromagnetic wave shield materials are laminated using any of various optically transparent resin substrates or glass substrates. From the viewpoint of safety, an optically transparent electromagnetic wave shield laminate using, as a substrate, a polycarbonate resin having superb impact resistance and heat resistance is preferable. When being used for covers or housings of industrial devices such as semiconductor production devices and the like, industrial machines, various electronic devices and the like, or for window materials or covers of automobiles, vehicles, seacrafts, aircrafts, dwellings, hospitals, office buildings and the like, the optically transparent electromagnetic wave shield laminate is often required to have a certain level of bendability from the viewpoints of design and safety. A polycarbonate resin needs to be bent at high temperature because of the high heat resistance thereof, and therefore, there are problems that an optically transparent electromagnetic wave shield laminate formed of a polycarbonate resin is warped, air-bubbled, whitened, peeled off or the like. Therefore, no technology for bending the optically transparent electromagnetic wave shield laminate has been disclosed.

As an adhesive for an optically transparent electromagnetic wave shield laminate, Patent Documents 4 and 5 describe acrylic-based, rubber-based, silicone-based, polyurethane-based, and polyester-based transparent tacky agents. Since a tacky agent does not have a sufficient adhesive force, there are problems that the optically transparent electromagnetic wave shield laminate is peeled off when being bent at high temperature and also air-bubbled or whitened due to the deterioration or decomposition of the adhesive layer.

As an adhesive for an optically transparent electromagnetic wave shield laminate, Patent Documents 6 and 7 describe adhesive compositions containing, as a main component, ethylene-vinyl acetate (EVA) copolymer adhesive composition or a copolymer of ethylene, vinyl acetate and/or (meth)acrylate-based monomer. All of these materials cause faults of being air-bubbled, whitened or peeled off when being bent at high temperature due to the deterioration or decomposition of the adhesive layer.

As an adhesive for an optically transparent electromagnetic wave shield laminate, Patent Document 8 describes hotmelt-type adhesives of an ethylene-vinyl acetate (EVA) copolymer or an ethylene-acrylic acid ester copolymer. All of these materials have problems of being air-bubbled, whitened or peeled off when being bent at high temperature due to the deterioration or decomposition of the adhesive layer.

As an adhesive for an optically transparent electromagnetic wave shield laminate, Patent Document 9 describes urethane-based adhesives. With such a polyurethane-based adhesive, although a certain level of adhesive force is obtained, the optically transparent electromagnetic wave shield laminate is whitened at a bent portion and the visibility is significantly decreased. This document discloses no explanation or example regarding the detailed compositions of the adhesives or processability thereof.

Patent Document 1: Japanese Laid-Open Patent Publication No. H08-39746
Patent Document 2: Japanese Patent No. 3994404
Patent Document 3: Japanese Laid-Open Patent Publication No. H09-239936
Patent Document 4: Japanese Laid-Open Patent Publication No. 2006-319251
Patent Document 5: Japanese Laid-Open Patent Publication No. H10-163673
Patent Document 6: Japanese Laid-Open Patent Publication No. 2001-26758
Patent Document 7: Japanese Laid-Open Patent Publication No. 2001-19925
Patent Document 8: Japanese Laid-Open Patent Publication No. 2004-140283
Patent Document 9: Japanese Laid-Open Patent Publication No. H11-330778

DISCLOSURE OF THE INVENTION

The present invention has an object of providing a polycarbonate resin laminate solving at least one of the above-described problems of the conventional art. The present invention also has an object of providing a polycarbonate resin laminate having superb transparency, adhesive force, heat resistance, humidity resistance, and bendability, which is not air-bubbled, whitened or peeled off due to the deterioration or decomposition of the adhesive layer even when being bent at high temperature and is usable even under stringent conditions of outdoors or inside of a vehicle.

The present invention has an object of providing an optically transparent electromagnetic wave shield laminate solving at least one of the above-described problems of the conventional art. The present invention also has an object of providing an optically transparent electromagnetic wave shield laminate having a superb bendability, which is not air-bubbled, whitened or peeled off due to the deterioration or decomposition of the adhesive layer even when being bent at high temperature.

As a result of performing active studies in order to solve the above-described problems, the present inventors found that at least one of the problems can be solved by a manufacturing method of a polycarbonate resin laminate, comprising the steps of laminating two or more layers of polycarbonate resin film and/or sheet using a (meth)acrylate-based adhesive composition containing a (A) (meth)acrylate monomer, a (B) meth(acrylate) oligomer, an (C) acrylamide derivative, and a (D) silane compound and/or an (E) organophosphorus compound to form a polycarbonate resin laminate; heating the laminate to a temperature of 130° C. to 185° C. (preferably 150° C. to 185° C.) while a temperature difference between a top surface and a bottom surface of the laminate is controlled to be within 20° C.; and bending the post-heating laminate into a curved shape having a radius of curvature of 10 mm or greater. A preferable embodiment of the present invention can provide a polycarbonate resin laminate having superb transparency, adhesive force, heat resistance, humidity resistance, and bendability, which does not cause an adhesive layer to be air-bubbled, whitened or peeled off due to the deterioration or decomposition of the adhesive layer, or is not warped, and is usable even under stringent conditions of outdoors or inside of a vehicle.

As a result of performing active studies in order to solve the above-described problems, the present inventors found that at least one of the problems can be solved by a manufacturing method of an optically transparent electromagnetic wave shield laminate, comprising the steps of laminating, on one or both of surfaces of an electromagnetic wave shield layer, a polycarbonate substrate (protecting layer) using a (meth)acrylate-based adhesive composition containing a (A) (meth)acrylate monomer, a (B) meth(acrylate) oligomer, an (C) acrylamide derivative, and a (D) silane compound and/or an (E) organophosphorus compound to form a laminate having two or more layers; heating the laminate to a temperature of 130° C. to 185° C. (preferably 150° C. to 185° C.) while a temperature difference between a top surface and a bottom surface of the laminate is controlled to be within 20° C.; and bending the post-heating laminate into a curved shape having a radius of curvature of 10 mm or greater. A preferable embodiment of the present invention can provide an optically transparent electromagnetic wave shield laminate having superb bendability, which does not cause an adhesive layer to be air-bubbled, whitened or peeled off due to the deterioration or decomposition of the adhesive layer, or is not warped.

A method for manufacturing a polycarbonate resin laminate, a manufacturing method of an optically transparent electromagnetic wave shield laminate, and a polycarbonate resin laminate and an optically transparent electromagnetic wave shield laminate each obtained by the respective method, according to the present invention, encompass the following embodiments.

(1) A method for manufacturing a laminate, comprising the steps of:

laminating two or more layers of polycarbonate resin film and/or sheet using a (meth)acrylate-based adhesive composition containing a (A) (meth)acrylate monomer, a (B) meth(acrylate) oligomer, an (C) acrylamide derivative, and a (D) silane compound and/or an (E) organophosphorus compound to form a laminate having a thickness of 0.1 mm to 30 mm;

heating the laminate at 130° C. to 185° C. so that a temperature difference between a top surface and a bottom surface of the laminate is within 20° C.; and bending the post-heating laminate into a curved shape having a radius of curvature of 10 mm or greater.

(2) The method for manufacturing a laminate according to (1) above, wherein the step of heating the laminate is the step of heating the laminate at 150° C. to 185° C.

(3) The method for manufacturing a laminate according to (1) or (2) above, wherein one of the two or more layers of polycarbonate resin film and/or sheet is an electromagnetic wave shield layer, and at least one of the two or more layers is a protecting layer.

(4) The method for manufacturing a laminate according to (3) above, wherein the electromagnetic wave shield layer contains a conductive compound containing at least one metal component selected from the group consisting of silver, copper, aluminum, nickel, carbon, ITO (indium oxide/tin oxide), ZnO, tin, zinc, titanium, tungsten and stainless steel.

(5) The method for manufacturing a laminate according to (3) or (4) above, wherein the electromagnetic wave shield layer has an electromagnetic wave shield performance of 30 decibel or greater.

(6) The method for manufacturing a laminate according to any one of (3) through (5) above, wherein the electromagnetic wave shield layer contains at least one selected from the group consisting of a metal thin film mesh, a metal woven mesh, a conductive fiber mesh, and a conductive printed mesh.

(7) The method for manufacturing a laminate according to (6) above, wherein the metal thin film mesh and the conductive printed mesh have a base substrate containing a polycarbonate resin, a polyethylene terephthalate resin, or a polyester resin.

(8) The method for manufacturing a laminate according to any one of (1) through (7) above, wherein the laminate has a 180 degree peel strength of 50 N/25 mm width or greater.

(9) The method for manufacturing a laminate according to any one of (1) through (8) above, wherein the laminate is not peeled or clouded after being treated for 200 hours under conditions of 65° C. and 95 RH %.

(10) The method for manufacturing a laminate according to any one of (1) through (9) above, wherein the (B) (meth) acrylate oligomer is at least one (meth)acrylate oligomer selected from the group consisting of urethane (meth)acrylate oligomer, polyester (meth)acrylate oligomer, epoxy (meth) acrylate oligomer, and polyol (meth)acrylate oligomer.

(11) The method for manufacturing a laminate according to (10) above, wherein the urethane (meth)acrylate oligomer is an alicyclic hydrocarbon compound.

(12) The method for manufacturing a laminate according to (11) above, wherein the urethane (meth)acrylate oligomer, which is the alicyclic hydrocarbon compound, is a compound derived from dicyclohexylmethaneisocyanate.

(13) The method for manufacturing a laminate according to any one of (1) through (12) above, wherein the (C) acrylamide derivative is alkyl acrylamide and/or alkyl methacrylamide.

(14) The method for manufacturing a laminate according to any one of (1) through (13) above, wherein the (C) acrylamide derivative is at least one selected from the group consisting of dimethyl acrylamide, isopropyl acrylamide, diethyl acrylamide, and 4-acrylomorpholine.

(15) The method for manufacturing a laminate according to any one of (1) through (14) above, wherein the (D) silane compound is at least one selected from the group consisting of amino-functional silane, epoxy-functional silane, vinyl-functional silane, mercapto-functional silane, methacrylate-functional silane, acrylamide-functional silane, and acrylate-functional silane.

(16) The method for manufacturing a laminate according to any one of (1) through (15) above, wherein the (D) silane compound is (3-(2,3-epoxypropoxy)propyl)trimethoxysilane.

(17) The method for manufacturing a laminate according to any one of (1) through (16) above, wherein the (E) organophosphorus compound is an acrylate phosphate compound.

(18) The method for manufacturing a laminate according to any one of (1) through (17) above, wherein the meth(acrylate)-based adhesive composition is a non-solvent (meth) acrylate-based adhesive composition.

(19) The method for manufacturing a laminate according to any one of (1) through (18) above, wherein the (meth)acrylate-based adhesive composition is a photocurable (meth) acrylate-based adhesive composition which is curable by visible light, an ultraviolet ray (UV) or an electron beam (EB).

(20) The method for manufacturing a laminate according to any one of (1) through (19) above, comprising the step of forming a cover film containing at least one selected from the group consisting of an antioxidant, an ultraviolet absorber and a photostabilizer on one or both of the surfaces of the laminate.

(21) The method for manufacturing a laminate according to (20) above, wherein the cover film contains a thermosetting resin or a photocurable resin.

(22) The method for manufacturing a laminate according to (20) or (21) above, wherein the cover film contains an acrylic-based resin compound or a silicone-based resin compound.

(23) The method for manufacturing a laminate according to any one of (1) through (22) above, wherein the layers containing the polycarbonate resin or the layers containing the (meth)acrylate-based adhesive composition contain at least one selected from the group consisting of an antioxidant, an ultraviolet absorber and a photostabilizer.

(24) A laminate manufactured by the method of any one of (1) through (23) above.

(25) The laminate of (24) above, which is usable for a cover of an electronic device, a shield material for a housing, a cover for a vehicle, a cover for a semiconductor production devices, or a shield material for a window material.

(26) A method for manufacturing a polycarbonate resin laminate, comprising the steps of:

laminating two or more layers of polycarbonate resin film and/or sheet using a (meth)acrylate-based adhesive composition containing a (A) (meth)acrylate monomer, a (B) meth(acrylate) oligomer, an (C) acrylamide derivative, and a (D) silane compound and/or an (E) organophosphorus compound to form a polycarbonate resin laminate having a thickness of 0.1 mm to 30 mm;

heating the laminate at 130° C. to 185° C. (preferably 150° C. to 185° C.) so that a temperature difference between a top surface and a bottom surface of the laminate is within 20° C.; and bending the post-heating laminate into a curved shape having a radius of curvature of 10 mm or greater.

(27) A method for manufacturing an optically transparent electromagnetic wave shield laminate, comprising the steps of:

laminating, on one or both of surfaces of an electromagnetic wave shield layer, a polycarbonate substrate (protecting layer) using a (meth)acrylate-based adhesive composition containing a (A) (meth)acrylate monomer, a (B) meth(acrylate) oligomer, an (C) acrylamide derivative, and a (D) silane compound and/or an (E) organophosphorus compound to form a laminate having a thickness of 0.1 mm to 30 mm;

heating the laminate at 130° C. to 185° C. (preferably 150° C. to 185° C.) so that a temperature difference between a top surface and a bottom surface of the laminate is within 20° C.; and bending the post-heating laminate into a curved shape having a radius of curvature of 10 mm or greater.

A polycarbonate resin laminate according to a preferable embodiment of the present invention does not cause an adhesive layer to be air-bubbled, whitened or peeled off due to the deterioration or decomposition of the adhesive layer, or is not warped, even when being bent at high temperature and is usable even under stringent conditions of outdoors or inside of a vehicle. Therefore, such a polycarbonate resin laminate is usable for a wide range of covers and window materials which need to have superb transparency, durability and bendability at the same time. Such covers and window materials include covers and window materials for industrial devices such as semiconductor production devices, flat panel display production devices and the like; covers and window materials for industrial machines such as cranes, excavators and the like; window materials for automobiles, vehicles, seacrafts and aircrafts; and window materials for dwellings, hospitals and office buildings; which need to have superb transparency, adhesive force, heat resistance, humidity resistance, and bendability.

An optically transparent electromagnetic wave shield laminate according to a preferable embodiment of the present invention does not cause an adhesive layer to be air-bubbled, whitened or peeled off due to the deterioration or decomposition of the adhesive layer, or is not warped, even when being bent at high temperature. Therefore, such an optically transparent electromagnetic wave shield laminate is usable for a wide range of electromagnetic wave shields which need to have superb electromagnetic wave shield performance, transparency, visibility, and bendability at the same time. Such electromagnetic wave shields include covers and housings of industrial devices and machines, electronic devices and the like, and window materials and covers of automobiles, vehicles, seacrafts, aircrafts, dwellings, hospitals and office buildings, which need to have superb transparency, visibility, and bendability.

BEST MODE FOR CARRYING OUT THE INVENTION

Hereinafter, a manufacturing method of a polycarbonate resin laminate, a manufacturing method of an optically transparent electromagnetic wave shield laminate, and a polycarbonate resin laminate and an optically transparent electromagnetic wave shield laminate each obtained by the respective method, according to the present invention, will be described in detail.

A manufacturing method of a polycarbonate resin laminate according to the present invention comprises the steps of laminating two or more layers of polycarbonate resin film and/or sheet using a (meth)acrylate-based adhesive composition containing a (A) (meth)acrylate monomer, a (B) meth(acrylate) oligomer, an (C) acrylamide derivative, and a (D) silane compound and/or an (E) organophosphorus compound to form a polycarbonate resin laminate having a thickness of 0.1 mm to 30 mm; heating the laminate to a temperature of 130° C. to 185° C. (preferably 150° C. to 185° C.) while a temperature difference between a top surface and a bottom surface of the laminate is controlled to be within 20° C.; and bending the post-heating laminate into a curved shape having a radius of curvature of 10 mm or greater.

A manufacturing method of an optically transparent electromagnetic wave shield laminate according to the present invention comprises the steps of laminating, on one or both of surfaces of an electromagnetic wave shield layer, a polycarbonate substrate (protecting layer) using a (meth)acrylate-based adhesive composition containing a (A) (meth)acrylate monomer, a (B) meth(acrylate) oligomer, an (C) acrylamide derivative, and a (D) silane compound and/or an (E) organophosphorus compound to form a laminate having two or more layers, the laminate having a thickness of 0.1 mm to 30 mm; heating the laminate to a temperature of 130° C. to 185° C. (preferably 150° C. to 185° C.) while a temperature difference between a top surface and a bottom surface of the laminate is controlled to be within 20° C.; and bending the post-heating laminate into a curved shape having a radius of curvature of 10 mm or greater.

A polycarbonate resin laminate and an optically transparent electromagnetic wave shield laminate manufactured by the respective manufacturing methods according to the present invention each have a 180 degree peel strength of preferably 50 N/25 mm width or greater and more preferably 50 to 300 N/25 mm width. A 180 degree peel strength of 50 N/25 mm width or greater is preferable because the laminate is not peeled off when being bent or bored.

The optically transparent electromagnetic wave shield laminate according to the present invention has two or more layers which include an electromagnetic wave shield layer, for preventing influx of an electromagnetic wave generated from various electronic devices, machines, motors and the like, and a polycarbonate substrate (protecting layer). The protecting layer may be provided on one or both of surfaces of the electromagnetic wave shield layer from the viewpoints of impact resistance, scratch resistance, weather resistance, water resistance, antistatic property, humidity resistance, antifogging property, anti-reflection property, contamination resistance and the like. The present invention encompasses all the laminate types of optically transparent electromagnetic wave shield laminate including an electromagnetic wave shield layer formed of a metal thin film mesh, a metal woven mesh, a conductive fiber mesh or a conductive printed mesh using a conductive compound.

The electromagnetic wave shield performance of the electromagnetic wave shield layer is preferably 30 decibel or greater. When the electromagnetic wave shield performance is less than 30 decibel, the electromagnetic wave shield layer cannot prevent influx of the electromagnetic wave generated from an electronic device completely and so may possibly cause malfunctions or communication failures of other machines or electronic devices, and cannot prevent invasion of the electromagnetic wave from the outside of the electronic device and may possibly damage the electronic device.

In order to realize the above-mentioned electromagnetic wave shield performance, the surface resistance ratio (sheet resistance value) of the electromagnetic wave shield layer is preferably 10[Ω/□] or less. More preferably, the surface resistance ratio is 1[Ω/□] or less, and still more preferably 0.1[Ω/□] or less.

For forming the electromagnetic wave shield layer, any conductive compound is usable with no specific limitation. For example, a metal compound containing at least one metal component selected from iron, gold, silver, copper, aluminum, nickel, carbon, ITO (indium oxide/tin oxide), ZnO (zinc oxide), tin, zinc, titanium, tungsten and stainless steel is usable. From an economic point of view, it is preferable to use a metal compound containing at least one metal component selected from silver, copper, aluminum, nickel, carbon, ZnO (zinc oxide), tin, and stainless steel.

The electromagnetic wave shield layer may contain, for example, a metal thin film mesh, a metal woven mesh, a conductive fiber mesh, or a conductive printed mesh each using a conductive compound. There is no specific limitation on the method for producing a metal thin film mesh. Usable methods include, for example, a method of forming a metal thin film of copper, silver, aluminum, ITO (indium oxide/tin oxide), ZnO (zinc oxide) or the like on a surface of an optically transparent organic polymer material film or sheet by vapor deposition or sputtering; a method of bonding foils of such a metal with an adhesive, and then forming a mesh by etching or the like; a method of applying a plating catalyst-containing ink or paste by gravure printing, inkjet printing, screen printing or the like, and then forming a mesh by electroless plating or electric plating; a method of rolling a metal plate of copper, silver, aluminum or the like to form a metal foil having a predetermined thickness and punching the metal foil to form a mesh; and the like. Such a metal thin film mesh is preferably blackened on one or both of surfaces thereof from the viewpoints of water resistance, humidity resistance, corrosion resistance, rust resistance, and anti-reflection property. The metal thin film mesh preferably has a line width in the range of 5 to 200 μm, a thickness in the range of 0.01 to 100 μm, and a pitch in the range of 100 to 1000 μm from the viewpoints of electromagnetic wave shield performance and transparency.

As an adhesive for metal foil usable for forming the metal thin film mesh, any known adhesive or tacky agent having good transparency, water resistance, humidity resistance and adhesive force is usable with no specific limitation. Examples of the adhesive include known photocurable adhesive, thermosetting adhesive, hotmelt-type adhesive and the like.

Examples of the tacky agent include known acrylic-based resin composition, polyurethane-based resin composition, polyester-based resin composition, epoxy-based resin composition, silicone-based resin composition, rubber-based resin composition, and the like. Among these, acrylic-based resin composition, which has good transparency, water resistance, humidity resistance and adhesive force, is most preferable as the tacky agent.

Examples of the hotmelt-type adhesive include polyolefin-based resin composition such as ethylene-(meth)acrylic acid copolymer resin composition, ethylene-(meth)acrylic acid ester copolymer resin composition or the like; polystyrene-based resin composition; ethylene vinyl acetate-based resin composition; vinyl acetate-based resin composition; acrylic-based resin composition; polyurethane-based resin composition; polyester-based resin composition; epoxy-based resin composition; polyester-based resin composition; polyamide-based resin composition; polyvinylether-based resin composition; silicone-based resin composition; rubber-based resin composition; and the like. Among these, acrylic-based resin composition, which has good transparency, water resistance, humidity resistance and adhesive force, is most preferable as the hotmelt-type adhesive.

There is no specific limitation on the thermosetting adhesive as long as the adhesive is polymerizable by heat. Examples of the thermosetting adhesive include compounds having a functional group such as glycidyl group, acryloyl group, methacryloyl group, hydroxyl group, carboxyl group, isocyanurate group, amino group, amide group or the like. These compounds are usable independently or in a combination of two or more. Usable compounds include, for example, epoxy-based resin composition, acrylic-based resin composition, silicone-based resin composition, phenol-based resin composition, thermosetting polyimide-based resin composition, polyurethane-based resin composition, polyester-based resin composition, melamine-based resin composition, urea-based resin composition and the like. From the viewpoints of adhesive force and transparency, acrylate-based resin compositions such as epoxy acrylate-based resin composition, urethane acrylate-based resin composition, polyether acrylate-based resin composition, polyester acrylate-based resin composition, and the like are preferable. Optionally, two or more of these thermosetting adhesives are usable together. Together with a thermosetting adhesive composition, a curing agent is preferably used. Usable curing agents include known curing agents such as isocyanate-based curing agent; amines such as triethylenetetramine, xylenediamine, N-aminotetramine, diaminodiphenylmethane and the like; acid anhydrides such as phthalic anhydride, maleic anhydride, dodecylsuccinic anhydride, pyromellitic anhydride, benzophenonetetracarboxylic anhydride, and the like; diaminodiphenylsulfone; tris(dimethylaminomethyl)phenol, polyamide resin, dicyandiamide; ethylmethylimidazole; and the like. These curing agents are usable independently or in a combination of two or more.

The photocurable adhesive is preferably at least one (meth) acrylate-based adhesive composition selected from, for example, urethane (meth)acrylate-based adhesive composition, polyester (meth)acrylate-based adhesive composition, epoxy (meth)acrylate-based adhesive composition, and polyol (meth)acrylate-based adhesive composition. Among these, urethane (meth)acrylate-based adhesive composition is especially preferable from the viewpoints of water resistance, humidity resistance, weather resistance, transparency and adhesive force.

Photocurable (meth)acrylate-based adhesive composition, which is curable when being irradiated with an active energy beam, is especially preferable in terms of curing time and safety. As the active energy beam, visible light or ultraviolet is preferable.

A conductive printed mesh obtained by any production method is usable with no specific limitation. The following method is one example. A metal particle compound of copper, silver, aluminum, nickel or the like or carbon is mixed with a binder of, for example, an epoxy-based, urethane-based, acrylic-based, or EVA-based resin to form an ink or paste. Using this ink or paste, a mesh is formed on a film or sheet surface of an optically transparent organic polymer material by screen printing, gravure printing, offset printing or the like. The conductive printed mesh preferably has a line width in the range of 10 to 200 μm, a thickness in the range of 1 to 100 μm, and a pitch in the range of 100 to 1000 μm from the viewpoints of electromagnetic wave shield performance and transparency.

Examples of the optically transparent organic polymer material used for the film or sheet substrate for forming the metal thin film mesh or the conductive printed mesh include polycarbonate resin, polyethylene terephthalate resin, polyester resin, polyethersulfone resin, polyethylene naphthalate resin, polystyrene resin, polyurethane resin, polyvinyl alcohol resin, polymethyl methacrylate resin, alicyclic polylolefin resin, optically transparent polyimide resin, polyamide resin, acrylic resin, polyacrylonitrile resin, polyvinyl chloride resin, polyvinylidene chloride resin, polypropylene resin, polyethylene resin and the like.

Among these optically transparent organic polymer materials, polycarbonate resin, polyester resin, and polyethylene terephthalate resin are especially preferable from the viewpoints of transparency, impact resistance, and versatility of use.

A metal fabric mesh obtained by any production method is usable with no specific limitation. According to an example of the method, a mesh is formed by knitting metal wires of stainless steel, copper, silver, gold, iron or the like. A mesh having a smaller mesh size and a larger diameter of the metal wires has a higher electromagnetic wave shield performance but has a lower visibility. Therefore, the mesh size is preferably in the range of 50 to 300 mesh, and the diameter of the metal wires is preferably in the range of 10 to 200 μM. Herein, the mesh size means the mesh size defined by the Taylor sieve.

A conductive fiber mesh obtained by any production method is usable with no specific limitation. According to an example of the method, a surface-treated synthetic fiber of polyester or the like is treated with electroless plating using a conductive metal compound such as nickel, copper or the like, and then blackened. The mesh size is preferably in the range of 50 to 300 mesh, and the diameter of the fiber is preferably in the range of 10 to 100 μm.

As described above, the optically transparent electromagnetic wave shield laminate according to the present invention has a polycarbonate substrate (protecting layer) on one or both of surfaces of the electromagnetic wave shield layer from the viewpoints of impact resistance, scratch resistance, weather resistance, water resistance, anti-static property, humidity resistance, antifogging property, anti-reflection property, contamination resistance and the like. The protecting layer may be formed of a film or sheet of an optically transparent organic polymer material or a cover film having any of various functions as long as being formed of a material which is visible and optically transparent (mainly formed of polycarbonate).

The polycarbonate resin laminate according to the present invention also preferably has a protecting layer on one or both of surfaces thereof from the viewpoints of impact resistance, scratch resistance, weather resistance, water resistance, anti-static property, humidity resistance, antifogging property, anti-reflection property, contamination resistance and the like. Herein, the protecting layer may be formed of a film or sheet of an optically transparent organic polymer material or a cover film having any of various functions as long as being formed of a material which is visible and optically transparent.

Any optically transparent organic polymer material which is visible and optically transparent is usable with no specific limitation. The "optically transparent organic polymer material" encompasses bonded, vapor-deposited, applied, printed or processed materials, such as various metal compounds, conductive compounds, organic compounds, inorganic compounds and the like. Examples of the optically transparent organic polymer material include polycarbonate resin, polyethylene terephthalate resin, polyester resin, polyether sulfone resin, polyethylene naphthalate resin, polystyrene resin, polyurethane resin, polyvinyl alcohol resin, polymethyl methacrylate resin, alicyclic polylolefin resin, optically transparent polyimide resin, polyamide resin, acrylic resin, polyacrylonitrile resin, polyvinyl chloride resin, polyvinylidene chloride resin, polypropylene resin, polyethylene resin, and the like.

For the cover film, any material is usable with no specific limitation. Preferable materials include silicone resin-based compound having a high durability against long-time use and a relatively high surface hardness, and acrylic resin and polyfunctional acrylic resin, which are relatively easy to be treated and provide a good cover film. The method for curing such a cover film varies in accordance with the properties of the resin compound used. In consideration of the productivity and convenience, it is preferable to select a thermosetting or photocurable resin. An example of the photocurable resin is a resin composition formed of a single or a plurality of types of resins such as mono-functional or polyfunctional acrylate monomer, oligomer or the like, to which a photoinitiator is added as a curing catalyst. Examples of the thermosetting resin include polyorganosiloxane-based resin, crosslinked acrylic-based resin, and the like. Such a resin composition is commercially available as a hard coat, and an appropriate type may be selected in consideration of the compatibility with the material of the cover film. To such a cover film, ultraviolet absorber, photostabilizer, and antioxidant may be added, and optionally, various types of stabilizers such as organic solvent, anti-coloring agent and the like; leveling agent; defoaming agent; thickener; antistatic agent; surfactant such as antifogging agent and the like; etc. may be optionally added.

For the optically transparent electromagnetic wave shield laminate according to the present invention, it is preferable to optionally install a ground wire in order to fully provide the shielding performance thereof and prevent a leak of the electromagnetic wave. There is no specific limitation on the method for installing the ground wire. Examples of the method are as follows. According to one method, a metal particle compound of copper, silver, aluminum, nickel or the like or carbon is mixed with a binder of, for example, an epoxy-based, urethane-based, acrylic-based, or EVA-based resin to form a conductive paste, and this paste is applied to an outer perimeter of an end surface of the optically transparent electromagnetic wave shield laminate. According to another method, an outer perimeter of an end surface of the optically transparent electromagnetic wave shield laminate is covered with a conductive tape. These methods may be combined. It is preferable that at least 70% of the outer perimeter of the end surface is covered with the conductive paste or tape.

The (meth)acrylate-based adhesive composition used in the present invention is preferably at least one selected from urethane (meth)acrylate-based adhesive composition, polyester (meth)acrylate-based adhesive composition, epoxy (meth)acrylate-based adhesive composition, and polyol (meth)acrylate-based adhesive composition, and more preferably urethane (meth)acrylate-based adhesive composition.

In consideration of the environmental friendliness and ease of handling, the (meth)acrylate-based adhesive composition used in the present invention is preferably a solvent-free (meth)acrylate-based adhesive composition. Preferable examples of the solvent-free (meth)acrylate-based adhesive composition include photocurable (meth)acrylate-based adhesive composition, thermosetting (meth)acrylate-based adhesive composition, hotmelt-type (meth)acrylate-based adhesive composition, and the like. Among these, photocurable (meth)acrylate-based adhesive composition which is curable when being irradiated with active energy is especially preferable in terms of curing time and safety. As the active energy, visible light and ultraviolet are preferable.

In the present invention, any of various types of (A) (meth)acrylate-based polymerizable monomer is usable with no specific limitation. Examples of the (meth)acrylate-based polymerizable monomer include mono-, di-, and poly(meth)acrylate compounds, of aliphatic alcohol, diol and polyhydric alcohol having a carbon number of 2 to 20; poly(meth)acrylate of hydroxy-terminated compound having a carbon number of 30 or less, having an aliphatic ether bond, an ester bond or a carbonate bond branched by a polyhydric alcohol such as glycerin, trimethylol propane, pentaerythritol or the like; compound having an alicyclic compound or an aromatic compound in the backbone thereof; and the like. Specific examples thereof include mono-functional (meth)acrylate-based polymerizable monomer having one (meth)acryloyloxy group in one molecule (hereinafter, referred to as the "mono-functional (meth)acrylate monomer"), bi-functional (meth)acrylate-based polymerizable monomer having two (meth)acryloyloxy groups in one molecule (hereinafter, referred to as the "bi-functional (meth)acrylate monomer"), and polyfunctional (meth)acrylate-based polymerizable monomer having at least three (meth)acryloyloxy groups in one molecule (hereinafter, referred to as the "polyfunctional (meth)acrylate monomer"). A single type of, or a combination of two or more types of, the (meth)acrylate monomer is usable.

Specific examples of the mono-functional (meth)acrylate monomer include tetrahydrofurfuryl (meth)acrylate, 2-hydroxyethyl (meth)acrylate, hydroxypropyl (meth)acrylate, 2-hydroxybutyl (meth)acrylate, 2-hydroxy-3-phenoxypropyl (meth)acrylate, isobutyl (meth)acrylate, t-butyl (meth)acrylate, 2-ethylhexyl (meth)acrylate, cyclohexyl (meth)acrylate, dicyclopentenyl (meth)acrylate, benzyl (meth)acrylate, isobornyl (meth)acrylate, phenoxyethyl (meth)acrylate, dicyclopentenyloxyethyl (meth)acrylate, dimethylaminoethyl (meth)acrylate, ethylcarbitol (meth)acrylate, trimethylolpropane mono(meth)acrylate, pentaerythritol mono(meth)acrylate, and phenoxypolyethyleneglycol (meth)acrylate. In addition, examples of carboxyl group-containing (meth)acrylate monomer include 2-(meth)acryloyloxyethylphthalic acid, 2-(meth)acryloyloxyethylhexahydrophthalic acid, carboxyethyl (meth)acrylate, 2-(meth)acryloyloxyethylsuccinic acid, N-(meth)acryloyloxy-N',N'-dicarboxy-p-phenylenediamine, 4-(meth)acryloyloxyethyltrimellitic acid, and the like. The "mono-functional (meth)acrylate monomer" encompasses vinyl-containing monomers such as N-vinylpyrrolidone and the like, and (meth)acryloylamino group-containing monomers such as 4-(meth)acryloylamino-1-carboxymethylpiperidine and the like.

Representative examples of the bi-functional (meth)acrylate monomer include alkyleneglycol di(meth)acrylates, polyoxyalkyleneglycol di(meth)acrylates, halogen-substituted alkyleneglycol di(meth)acrylates, di(meth)acrylate of fatty acid polyol, alkylene oxide-adduct di(meth)acrylates of bisphenol A or bisphenol F, epoxy di(meth)acrylates of bisphenol A or bisphenol F, and the like. The bi-functional (meth)acrylate monomer is not limited to these, and various other materials are usable. Specific examples of the bi-functional (meth)acrylate monomer include ethyleneglycol di(meth)acrylate, 1,3-butanediol di(meth)acrylate, 1,4-butanediol di(meth)acrylate, 1,6-hexanediol di(meth)acrylate, 1,9-nonanediol di(meth)acrylate, neopentylglycol di(meth)acrylate, trimethylolpropane di(meth)acrylate, pentaerythritol di(meth)acrylate, ditrimethylolpropane di(meth)acrylate, diethyleneglycol di(meth)acrylate, triethyleneglycol di(meth)acrylate, dipropyleneglycol di(meth)acrylate, tripropyleneglycol di(meth)acrylate, polyethyleneglycol di(meth)acrylate, polypropyleneglycol di(meth)acrylate, polytetramethyleneglycol di(meth)acrylate, hydroxypivalic acid ester neopentylglycol di(meth)acrylate, 2,2-bis[4-(meth)acryloyloxyethoxyethoxyphenyl]propane, 2,2-bis[4-(meth)acryloyloxyethoxyethoxycyclohexyl]propane, 2,2-bis[4-(meth)acryloyloxyethoxyethoxyphenyl]methane, water-added dicyclopentadienyl di(meth)acrylate, and tris(hydroxyethyl)isocyanurate di(meth)acrylates.

Representative examples of the polyfunctional (meth)acrylate monomer include poly(meth)acrylates of at least trihydric aliphatic polyol such as glycerin tri(meth)acrylate, trimethylolpropane tri(meth)acrylate, ditrimethylolpropane tri(meth)acrylate, ditrimethylolpropane tetra(meth)acrylate, pentaerythritol tri(meth)acrylate, pentaerythritol tetra(meth)acrylate, dipentaerythritol tetra(meth)acrylate, dipentaerythritol penta(meth)acrylate, dipentaerythritol hexa(meth)acrylate, and the like. Other examples of the poly(meth)acrylate monomer include poly(meth)acrylates of at least trihydric halogen-substituted polyol, glycerin alkylene oxide-adduct tri(meth)acrylate, trimethylolpropane alkylene oxide-adduct tri(meth)acrylate, 1,1,1-tris[(meth)acryloyloxyethoxyethoxy]propane, and tris(hydroxyethyl)isocyanurate tri(meth)acrylates.

Examples of the (B) (meth)acrylate oligomer used in the present invention include at least bi-functional polyfunctional urethane (meth)acrylate oligomer (hereinafter, referred to as the "polyfunctional urethane (meth)acrylate oligomer"), at least bi-functional polyfunctional polyester (meth)acrylate oligomer (hereinafter, referred to as the "polyfunctional polyester (meth)acrylate oligomer"), at least bi-functional polyfunctional epoxy (meth)acrylate oligomer (hereinafter, referred to as the "polyfunctional epoxy (meth)acrylate oligomer"), at least bi-functional polyfunctional polyol (meth)acrylate oligomer (hereinafter, referred to as the "polyfunctional polyol (meth)acrylate oligomer"), and the like. A single type of, or a combination of two or more types of, the (meth)acrylate oligomer is usable.

An example of the polyfunctional urethane (meth)acrylate oligomer is a urethanization reaction product of an isocyanate compound obtained by reacting a polyol with polyisocyanate and a (meth)acrylate monomer having at least one (meth)acryloyloxy group and at least one hydroxyl group in one molecule. Among the urethane (meth)acrylate-based oligomers, urethane (meth)acrylate-based oligomers containing an alicyclic hydrocarbon compound, which is superb in water resistance, humidity resistance, weather resistance, and adhesive force, are preferable. Among these, a urethane (meth)acrylate-based oligomer using isophorone diisocyanate or dicyclohexylmethane diisocyanate as a starting material is more preferable. A urethane (meth)acrylate-based oligomer using dicyclohexylmethane diisocyanate as a starting material is especially preferable.

Examples of the (meth)acrylate monomer having at least one (meth)acryloyloxy group and at least one hydroxyl group in one molecule and used for the urethanization reaction include 2-hydroxyethyl (meth)acrylate, 2-hydroxypropyl (meth)acrylate, 2-hydroxybutyl (meth)acrylate, 2-hydroxy-3-phenoxypropyl (meth)acrylate, glycerin di(meth)acrylate, trimethylolpropane di(meth)acrylate, and pentaerythritol tri(meth)acrylate, and dipentaerythritol penta(meth)acrylate.

Examples of the polyisocyanate used for the urethanization reaction include di- or tri-isocyanate such as hexamethylene diisocyanate, lysine diisocyanate, isophorone diisocyanate, dicyclohexylmethane diisocyanate, tolylene diisocyanate, xylylene diisocyanate, diisocyanate (among these diisocyanates) obtained by adding hydrogen to aromatic isocyanate (e.g., diisocyanate such as hydrogen-added tolylene diisocyanate, hydrogen-added xylylene diisocyanate, or the like), triphenylmethane triisocyanate, dimethylenetriphenyl triisocyanate and the like; and polyisocyanate obtained by multimerization of diisocyanate. Among these, isophorone diisocyanate and dicyclohexylmethane diisocyanate, which are superb in water resistance, humidity resistance, and weather resistance, are preferable. Dicyclohexylmethane diisocyanate is especially preferable.

Example of the polyol generally used for the urethanization reaction include aromatic, aliphatic and alicyclic polyols, and also polyester polyol, polyether polyol, and the like. Usually, examples of the aliphatic and alicyclic polyols include 1,4-butanediol, 1,6-hexanediol, neopentylglycol, ethyleneglycol, propyleneglycol, trimethylolethane, trimethylolpropane, dimethylolheptane, dimethylolpropionic acid, dimethylolbutylionic acid, glycerin, water-added bisphenol A, and the like.

Polyester polyol is obtained by dehydrogenation-condensation reaction of a polyol described above and a polybasic carboxylic acid (anhydride). Specific examples of the polybasic carboxylic acid include succinic acid (anhydride), adipic acid, maleic acid (anhydride), trimellitic acid (anhydride), hexahydrophthalic acid (anhydride), phthalic acid (anhydride), isophthalic acid, terephthalic acid, and the like. Examples of the polyether polyol include polyalkyleneglycol, and polyoxyalkylene-denatured polyol obtained by the reaction of a polyol or phenol with alkylene oxide.

As the urethane (meth)acrylate-based oligomer, many types are commercially available and easily obtainable. Examples of the urethane (meth)acrylate-based oligomer include Beam Set 575, Beam Set 551B, Beam Set 550B, Beam Set 505A-6, Beam Set 504H, Beam Set 510, Beam Set 502H, Beam Set 575CB, and Beam Set 102 (trade names of the urethane (meth)acrylate-based oligomers produced by Arakawa Chemical Industries, Ltd.); Photomer 6008 and Photomer 6210 (trade names of the urethane (meth)acrylate-based oligomers produced by San Nopco Limited); NK Oligo U-4HA, NK Oligo U-108A, NK Oligo U-1084A, NK Oligo U-200AX, NK Oligo U-122A, NK Oligo U-340A, NK Oligo U-324A, NK Oligo UA-100, and NK Oligo MA-6 (trade names of the urethane (meth)acrylate-based oligomers produced by Shin-Nakamura Chemical Co., Ltd.); Aronix M-1100, Aronix M-1200, Aronix M-1210, Aronix M-1310, Aronix M-1600, and Aronix M-1960 (trade names of the urethane (meth)acrylate-based oligomers produced by Toagosei Co., Ltd.); AH-600, AT-606, and UA-306H (trade names of the urethane (meth)acrylate-based oligomers produced by Kyoeisha Chemical Co., Ltd.); Karayad UX-2201, Karayad UX-2301, Karayad UX-3204, Karayad UX-3301, Karayad UX-4101, Karayad UX-6101, and Karayad UX-7101 (trade names of the urethane (meth)acrylate-based oligomers produced by Nippon Kayaku Co., Ltd.); Shiko UV-1700B, Shiko UV-3000B, Shiko UV-3300B, Shiko UV-3520TL, Shiko UV-3510TL, Shiko UV-6100B, Shiko UV-6300B, Shiko UV-7000B, Shiko UV-7210B, Shiko UV-7550B, Shiko UV-2000B, Shiko UV-2250TL, Shiko UV-2010B, Shiko UV-2580B, and Shiko UV-2700B (trade names of the urethane (meth)acrylate-based oligomers produced by The Nippon Synthetic Chemical Industry Co., Ltd.); Artresin UN-9000PEP, Artresin UN-9200A, Artresin UN-9000H, Artresin UN-1255, Artresin UN-5200, Artresin UN-2111A, Artresin UN-330, Artresin UN-3320HA, Artresin UN-3320HB, Artresin UN-3320HC, Artresin UN-332011S, and Artresin UN-6060P (trade names of the urethane (meth)acrylate-based oligomers produced by Negami Chemical Industrial Co., Ltd.); Laromer UA19T, Laromer LR8949, Laromer LR8987, and Laromer LR8983 (trade names of the urethane (meth)acrylate-based oligomers produced by BASF); Diabeam UK6053, Diabeam UK6055, Diabeam UK6039, Diabeam UK6038, Diabeam UK6501, Diabeam UK6074, and Diabeam UK6097 (trade names of the urethane (meth)acrylate-based oligomers produced by Mitsubishi Rayon Co., Ltd.); Ebecryl 254, Ebecryl 264, Ebecryl 265, Ebecryl 1259, Ebecryl 4866, Ebecryl 1290K, Ebecryl 5129, Ebecryl 4833, and Ebecryl 2220 (trade names of the urethane (meth)acrylate-based oligomers produced by Daicel UCB Kabushik Kaisha); and the like.

The polyfunctional polyester (meth)acrylate oligomer is obtained by dehydrogenation-condensation reaction of a (meth)acrylic acid, a polybasic carboxylic acid (anhydride) and a polyol. Examples of the polybasic carboxylic acid (anhydride) used for the dehydrogenation-condensation reaction include succinic acid (anhydride), adipic acid, maleic acid (anhydride), itaconic acid (anhydride), trimellitic acid (anhydride), pyromellitic acid (anhydride), hexahydrophthalic acid (anhydride), phthalic acid (anhydride), isophthalic acid, terephthalic acid, and the like. Examples of the polyol used for the dehydrogenation-condensation reaction include 1,4-butanediol, 1,6-hexanediol, diethyleneglycol, triethyleneglycol, propyleneglycol, neopentylglycol, dimethylolheptane, dimethylolpropionic acid, dimethylolbutylionic acid, trimethylolpropane, ditrimethylolpropane, pentaerythritol, dipentaerythritol, and the like.

Specific examples of the polyester (meth)acrylate-based oligomer include Aronix M-6100, Aronix M-7100, Aronix M-8030, Aronix M-8060, Aronix M-8530, and Aronix M-8050 (trade names of the polyester (meth)acrylate-based oligomers produced by Toagosei Co., Ltd.); Laromer PE44F, Laromer LR8907, Laromer PE55F, Laromer PE46T, and Laromer LR8800 (trade names of the polyester (meth)acrylate-based oligomers produced by BASF); Ebecryl 80, Ebecryl 657, Ebecryl 800, Ebecryl 450, Ebecryl 1830, and Ebecryl 584 (trade names of the polyester (meth)acrylate-based oligomers produced by Daicel UCB Kabushik Kaisha); Photomer RCC13-429 and Photomer 5018 (trade names of the polyester (meth)acrylate-based oligomers produced by San Nopco Limited); and the like.

The polyfunctional epoxy (meth)acrylate oligomer is obtained by addition reaction of a polyglycidylether and a (meth)acrylic acid. Any of various types of epoxy (meth)acrylate-based oligomer is usable with no specific limitation. The epoxy (meth)acrylate-based oligomer has a structure obtained by adding an epoxy-based oligomer and a (meth)acrylic acid, and is available in bisphenol A-epichlorhydrin-type, denatured bisphenol A-type, amine-denatured-type, phenolnovolac-epichlorhydrin-type, aliphatic type, alicyclic type and the like. Examples of the polyglycidylether include ethyleneglycoldiglycidylether, propyleneglycoldiglycidylether, tripropyleneglycoldiglycidylether, 1,6-hexanedioldiglycidylether, bisphenol A diglycidylether, and the like.

Specific examples of the epoxy (meth)acrylate-based oligomer include Laromer LR8986, Laromer LR8713, and Laromer EA81 (trade names of the epoxy (meth)acrylate-based oligomers produced by BASF); NK Oligo EA-6310, NK Oligo EA-1020, NK Oligo EMA-1020, NK Oligo EA-6320, NK Oligo EA-7440, and NK Oligo EA-6340 (trade names of the epoxy (meth)acrylate-based oligomers produced by Shin-Nakamura Chemical Co., Ltd.); Ebecryl 3700, Ebecryl 3200, and Ebecryl 600 (trade names of the epoxy (meth)acrylate-based oligomers produced Daicel UCB Kabushik Kaisha); and the like.

The (meth)acrylate-based adhesive composition used in the present invention contains an (C) acrylamide derivative. By incorporating the (C) acrylamide derivative as a reactive monomer to the (meth)acrylate-based adhesive composition, the humidity resistance, water resistance, adhesive force, processability and transparency are improved. Any of various types of (C) acrylamide derivative is usable with no specific limitation. Examples of the acrylamide derivative include alkylacrylamide and/or alkylmethacrylamide. Specific examples of the acrylamide derivative include acrylamide, methacrylamide, diacetoneacrylamide, diacetonemethacrylamide, alkylenebisacrylamide, dimethylacrylamide, diethylacrylamide, isopropylacrylamide, and 4-acrylomorpholine. Dimethylacrylamide, isopropylacrylamide, diethylacrylamide, and 4-acrylomorpholine are more preferable. These materials may be used independently or in a combination of two or more. The content thereof is usually 1 to 50% by weight, and preferably 5 to 30% by weight.

The (meth)acrylate-based adhesive composition used in the present invention contains a (D) silane compound. The (D) silane compound is used as an adhesion promoter of the (meth)acrylate-based adhesive composition, and has an effect of improving the adhesive force and also improving the humidity resistance, water resistance, weather resistance and transparency. In the present invention, any of various types of (D) silane compound is usable with no specific limitation. Examples of the silane compound include amino functional silane, epoxy functional silane, vinyl functional silane, mercapto functional silane, methacrylate functional silane, acrylamide functional silane, and acrylate functional silane. These materials may be used independently or in a combination of two or more. Among these silane compounds, amino functional silane, epoxy functional silane, vinyl functional silane, and mercapto functional silane are especially preferable. Specific examples of these preferable silane compounds include aminosilanes such as γ-aminopropyltriethoxysilane, γ-aminopropyltrimethoxysilane, N-β(aminoethyl)-γ-aminopropyltrimethoxysilane, N-β(aminoethyl)-γ-aminopropylmethyldimethoxysilane, N-phenyl-γ-aminopropyltrimethoxysilane, and the like; epoxysilanes such as (3-(2,3-epoxypropoxy)propyl)trimethoxysilane, β-(3,4-epoxycyclohexyl)ethyltrimethoxysilane, γ-glycidoxypropyltrimethoxysilane, γ-glycidoxypropyltriethoxysilane, and the like; vinylsilanes such as vinyltris(β-methoxyethoxy)silane, vinyltriethoxysilane, vinyltrimethoxysilane, γ-methacryloxypropyltrimethoxysilane, and the like; hexamethyldisilazane; γ-mercaptopropyltrimethoxysilane; and the like. Among these, epoxysilanes such as (3-(2,3-epoxypropoxy)propyl)trimethoxysilane, (3-(3,4-epoxycyclohexyl)ethyltrimethoxysilane, γ-glycidoxypropyltrimethoxysilane, and γ-glycidoxypropyltriethoxysilane are more preferable. (3-(2,3-epoxypropoxy)propyl)trimethoxysilane is especially preferable. These materials may be used independently or in a combination of two or more. The content thereof is usually 0.1 to 20% by weight, and preferably 1 to 10% by weight.

The (meth)acrylate-based adhesive composition used in the present invention contains an (E) organophosphorus compound. The (E) organophosphorus compound is used as an adhesion promoter of the (meth)acrylate-based adhesive composition to a metal compound, and has an effect of improving the adhesive force to a metal compound and also improving the humidity resistance and water resistance. In the present invention, any (E) organophosphorus compound is usable with no specific limitation, but (meth)acrylate phosphate is especially preferable. As the (meth)acrylate phosphate, any (meth)acrylate having a phosphoric acid ester backbone is usable. Examples of such a (meth)acrylate phosphate are not limited to monoester, diester, triester or the like, and include ethylene oxide-denatured phenoxylated (meth)acrylate phosphate, ethylene oxide-denatured butoxylated (meth)acrylate phosphate, ethylene oxide-denatured octyloxylated (meth)acrylate phosphate, ethylene oxide-denatured di(meth)acrylate phosphate, ethylene oxide-denatured tri(meth)acrylate phosphate, and the like. In more detail, mono[2-(meth)acryloyloxyethyl] phosphate, mono[2-(meth)acryloyloxyethyl]diphenyl phosphate, mono[2-(meth)acryloyloxypropyl] phosphate, bis[2-(meth)acryloyloxyethyl] phosphate, bis[2-(meth)acryloyloxypropyl] phosphate, tris[2-(meth)acryloyloxyethyl] phosphate and the like are usable. These materials may be used independently or in a combination of two or more. The content thereof is usually 0.1 to 20% by weight, and preferably 1 to 10% by weight.

In the present invention, the photoinitiator is used in order to polymerize and cure the (meth)acrylate-based adhesive composition and increase the curing rate. In the present invention, any generally known photoinitiator is usable. Examples of the photoinitiator include 2,2-dimethoxy-1,2-diphenylethane-1-one, 2-hydroxy-2-methyl-1-phenyl-propane-1-one, 1-hydroxy-cyclohexylphenylketone, oligo[2-hydroxy-2-methyl-1-[4-(1-methylvinyl)phenyl]propanone], bis(2,4,6-trimethylbenzoyl)phenylphosphine oxide 3-methylacetophenone, 2,2-dimethoxy-2-phenylacetophenone, xanthone, fluorenone, benzaldehyde, fluorene, anthraquinone, triphenylamine, carbazole, 3-methylacetophenone, benzophenone, 4-chlorobenzophenone, 4,4'-dimethoxybenzophenone, 4,4'-diaminobenzophenone, benzomethylether, benzoinpropylether, michler's ketone, benzyldimethylketal, 1-(4-isopropylphenyl)-2-hydroxy-2-methylpropane-1-one, 1-(4-dodecylphenyl)-2-hydroxy-2-methylpropane-1-one, 4-(2-hydroxyethoxy)phenyl-(2-hydroxy-2-propyl)ketone, 2-methyl-1-[4-(methylthio)phenyl]-2-morpholino-propane-1-one, 2,4,6-trimethylbenzoylphenylphosphinate, 2,4,6-trimethylbenzoyldiphenylphosphine oxide, 2-benzyl-2-dimethylamino-1-(4-morpholinophenyl)-butane-1-one, bis(2,6-dimethoxybenzoyl)-2,4,4-trimethylpentylphosphine oxide, methylbenzoyl formate, thioxanthone, diethylthioxanthone, 2-isopropylthioxanthone, 2-chlorothioxanthone, and the like. Among these, 2,2-dimethoxy-1,2-diphenylethane-1-one, 2-hydroxy-2-methyl-1-phenyl-propane-1-one, 1-hydroxy-cyclohexylphenylketone, oligo[2-hydroxy-2-methyl-1-[4-(1-methylvinyl)phenyl]propanone], and bis(2,4,6-trimethylbenzoyl)phenylphosphine oxide are more preferable. These materials may be used independently or in a combination of two or more. The content thereof is usually 0.5 to 20% by weight, and preferably 1 to 10% by weight.

As the photoinitiator, many types are commercially available and easily obtainable. Specific examples of the photoinitiator include Irgacure 184, Irgacure 261, Irgacure 369, Irgacure 379, Irgacure 500, Irgacure 651, Irgacure 819, Irgacure 907, Irgacure 1700, Irgacure 1800, Irgacure 1850, Irgacure 2959, Irgacure CGI-403, Darocure 953, Darocure 1116, Darocure 1173, Darocure 1664, Darocure 2273, and Darocure 4265 (produced by Ciba Specialty Chemicals), and the like.

As the polymerization initiator for the (meth)acrylate-based adhesive composition used in the present invention, a thermal polymerization initiator is also usable. An example of the usable thermal polymerization initiator is selected from azo compounds such as 2,2'-azobis(isobutylonitrile) and the like; hydroperoxides such as t-butylhydroperoxide and the like; and peroxides such as benzoyl peroxide, cyclohexanone peroxide, and the like. The usable thermal polymerization initiator is not limited to these. These materials may be used independently or in a combination of two or more.

In addition to the photoinitiator, at least one type of photosensitizer may be optionally added to the (meth)acrylate-based adhesive composition to control the curing time and curing state. The photosensitizer may be selected from amine compound, urea compound, phosphorus compound, nitrile compound, benzoin compound, carbonyl compound, sulfur compound, naphthalene-based compound, condensed aromatic hydrocarbon and mixtures thereof. Specific examples of the photosensitizer include amine compounds such as triethylamine, diethylaminoethyl methacrylate, N-methyldiethanolamine, and the like; benzoin compounds such as 4-dimethylaminoethyl benzoate, 4-dimethylaminoisoamyl benzoate, benzoin, benzoinmethylether, benzomethylether, benzoinisobutylether, benzoinoctylether, and the like; carbonyl compounds such as benzyl, diacetyl, diethoxyacetophenone, 2-hydroxy-2-methylpropiophenone, 4'-isopropyl-2-hydroxy-2-methylpropiophenone, methylanthraquinone, acetophenone, benzophenone, benzoyl methyl formate, benzyldimethylketal, 1-hydroxycyclohexylphenylketone, 2-methyl-1-(4-(methylthio)phenyl)-2-morpholino)-propene-1,2, 2-dimethoxy-2-phenylacetophenone, and the like; sulfur compounds such as diphenyldisulfide, dithiocarbamate, and the like; naphthalene-based compounds such as α-chlormethylnaphthalene, and the like; condensed aromatic hydrocarbons such as anthracene, and the like; and metal salts such as iron chloride, and the like. These materials may be used independently or in a combination of two or more. The content thereof is usually 0.1 to 5% by weight, and preferably 0.5 to 3% by weight. As the above-mentioned photosensitizer, a material which has a superb solubility in the (meth)acrylate-based adhesive composition and does not inhibit the ultraviolet transmissivity thereof is preferable.

To the (meth)acrylate-based adhesive composition used in the present invention, a photostabilizer and an antioxidant may be added in order to prevent aging by hydrolysis or oxidation of the adhesive composition itself or to improve the heat resistance, weather resistance and the like under severe conditions of being exposed to sunlight or wind and rain.

Examples of a hindered amine-based photostabilizer include bis(2,2,6,6-tetramethyl-4-piperidyl)sebacate, bis(1,2,2,6,6-pentamethyl-4-piperidyl)sebacate, bis(1,2,2,6,6-pentamethyl-4-piperidyl)-2-(3,5-di-t-butyl-4-hydroxybenzyl)-2-n-butyl malonate, 1-methyl-8-(1,2,2,6,6-pentamethyl-4-piperidyl)-sebacate, 1-[2-[3-(3,5-di-t-butyl-4-hydroxyphenyl)propionyloxy]ethyl]-4-[3-(3,5-di-t-butyl-4-hydroxyphenyl)propionyloxy]-2,2,6,6-tetramethylpiperidine, 4-benzoyloxy-2,2,6,6-tetramethylpiperidine, tetrakis(2,2,6,6-tetramethyl-4-piperidyl)-1,2,3,4-butane-tetracarboxylate, triethylenediamine, 8-acetyl-3-dodecyl-7,7,9,9-tetramethyl-1,3,8-triazaspiro[4,5]decane-2,4-dione, and the like.

Examples of a usable nickel-based ultraviolet stabilizer include [2,2'-thiobis(4-t-octylphenolate)]-2-ethylhexylaminenickel(II), nickel complex-3,5-di-t-butyl-4-hydroxybenzyl-monoethylate phosphate, nickel-dibutyl-dithiocarbamate, and the like. Especially, a preferable hindered amine-based photostabilizer contains only tertiary amine. Specific examples of such a preferable hindered amine-based photostabilizer include bis(1,2,2,6,6-pentamethyl-4-piperidyl)-sebacate, bis(1,2,2,6,6-pentamethyl-4-piperidyl)-2-(3,5-di-t-butyl-4-hydroxybenzyl)-2-n-butyl malonate, and a condensate of 1,2,2,6,6-pentamethyl-4-piperidinol/tridecyl alcohol and 1,2,3,4-butanetetracarboxylic acid.

As an antioxidant, it is preferable to use phenol-based antioxidant, thiol-based antioxidant, or phosphite-based antioxidant. Examples of the phenol-based antioxidant include 1,1,3-tris(2-methyl-4-hydroxy-5-t-butylphenyl)butane, 2,2'-methylenebis(4-ethyl-6-t-butylphenol), tetrakis-[methylene-3-(3',5'-di-t-butyl-4'-hydroxyphenyl)propionate]methane, 2,6-di-t-butyl-p-cresol, 4,4'-thiobis(3-methyl-6-t-butylphenol), 4,4'-butylidene bis(3-methyl-6-t-butylphenol), 1,3,5-tris(3',5'-di-t-butyl-4'-hydroxybenzyl)-S-triazine-2,4,6-(1H, 3H,5H)trione, stearyl-β-(3,5-di-t-butyl-4-hydroxyphenyl) propionate, triethyleneglycolbis[3-(3-t-butyl-5-methyl-4-hydroxyphenyl)propionate], 3,9-bis[1,1-di-methyl-2-[β-(3-t-butyl-4-hydroxy-5-methylphenyl)propionyloxy]ethyl]-2,4,8,10-tetraoxaspiro[5,5]undecane, 1,3,5-trimethyl-2,4,6-tris (3,5-di-t-butyl-4-hydroxybenzyl)benzene, and the like. Especially, a phenol-based antioxidant having a molecular weight of 550 or greater is preferable.

Examples of the thiol-based antioxidant include distearyl-3,3'-thiodipropionate, pentaerythritol-tetrakis-(β-lauryl-thiopropionate), and the like. Examples of the phosphite-based antioxidant include tris(2,4-di-t-butylphenyl)phosphite, distearylpentaerythritoldiphosphite, di(2,6-di-t-butylphenyl)pentaerythritoldiphosphite, bis-(2,6-di-t-butyl-4-methylphenyl)-pentaerythritoldiphosphite, tetrakis(2,4-di-t-butylphenyl)-4,4'-biphenylene-diphosphonite, 2,2'-methylenebis(4,6-di-t-butylphenyl)octylphosphite, and the like.

These photostabilizers and antioxidants may be used independently or in a combination of two or more. Especially, a combination of a hindered amine-based photostabilizer and a hindered phenol-based antioxidant is preferable. The content thereof is usually 0.1 to 10% by weight, and preferably 0.5 to 3% by weight. As each of the above-mentioned photostabilizer and antioxidant, a material which has a superb solubility in the (meth)acrylate-based adhesive composition and does not inhibit the ultraviolet transmissivity thereof is preferable.

To the (meth)acrylate-based adhesive composition used in the present invention, a ultraviolet absorber may be added in order to prevent deterioration by sunlight or ultraviolet. Examples of the ultraviolet absorber include benzophenone-based, benzotriazole-based, phenyl salicylate-based, triazine-based ultraviolet absorbers.

Examples of the benzophenone-based ultraviolet absorber include 2,4-dihydroxy-benzophenone, 2-hydroxy-4-methoxy-benzophenone, 2-hydroxy-4-n-octoxy-benzophenone, 2-hydroxy-4-dodesiloxy-benzophenone, 2-hydroxy-4-octadesiloxy-benzophenone, 2,2'-dihydroxy-4-methoxy-benzophenone, 2,2'-dihydroxy-4,4'-dimethoxy-benzophenone, 2,2',4,4'-tetrahydroxy-benzophenone, and the like.

Examples of the benzotriazole-based ultraviolet absorber include 2-(2'-hydroxy-5-methylphenyl)benzotriazole, 2-(2'-hydroxy-3',5'-di-t-butylphenyl)benzotriazole, 2-(2'-hydroxy-3'-t-butyl-5'-methylphenyl)benzotriazole, and the like.

Examples of the phenyl salicylate-based ultraviolet absorber include phenyl salicylate, 2-4-di-t-butylphenyl-3,5-di-t-butyl-4-hydroxy benzoate, and the like. Examples of a hindered amine-based ultraviolet absorber include bis(2,2,6,6-tetramethylpiperidine-4-yl)sebacate, and the like.

Examples of the triazine-based ultraviolet absorber include 2,4-diphenyl-6-(2-hydroxy-4-methoxyphenyl)-1,3,5-triazine, 2,4-diphenyl-6-(2-hydroxy-4-ethoxyphenyl)-1,3,5-triazine, 2,4-diphenyl-(2-hydroxy-4-propoxyphenyl)-1,3,5-triazine, 2,4-diphenyl-(2-hydroxy-4-butoxyphenyl)-1,3,5- triazine, 2,4-diphenyl-6-(2-hydroxy-4-butoxyphenyl)-1,3,5-triazine, 2,4-diphenyl-6-(2-hydroxy-4-hexyloxyphenyl)-1,3,5-triazine, 2,4-diphenyl-6-(2-hydroxy-4-octyloxyphenyl)-1,3,5-triazine, 2,4-diphenyl-6-(2-hydroxy-4-dodecyloxyphenyl)-1,3,5-triazine, 2,4-diphenyl-6-(2-hydroxy-4-benzyloxyphenyl)-1,3,5-triazine, and the like.

Examples of the ultraviolet absorber include, in addition to the above-mentioned materials, compounds having a function of converting an energy of the ultraviolet into a vibrating energy in the molecules thereof and releasing the vibrating energy as a thermal energy or the like. Moreover, a material exhibiting an effect when used together with an antioxidant, a colorant or the like, or a photostabilizer called "quencher" which acts like a photoenergy converter, may be used together with the ultraviolet absorber. It should be noted that when any of the above-mentioned ultraviolet absorbers is used, an ultraviolet absorber having a photo-absorbing wavelength which does not overlap the effective wavelength of the photoinitiator needs to be selected. When a usual ultraviolet blocking agent is used, a photoinitiator generating a radical with visible light is effectively usable.

The amount of the ultraviolet absorber is usually 0.1 to 20% by weight, preferably 1 to 15% by weight, and more preferably 3 to 10% by weight. When the amount of the ultraviolet absorber is larger than 20% by weight, the adhesiveness is poor, and when the ultraviolet absorber is smaller than 0.1% by weight, the effect of improving the weather resistance is poor.

To the (meth)acrylate-based adhesive composition used in the present invention, various other additives may be added. For example, defoaming agent, leveling agent, antistatic agent, surfactant, storage stabilizer, thermal polymerization inhibitor, plasticizer, wettability improving agent, adhesiveness adding agent, viscosity adding agent, and the like may be optionally added.

A method for preparing the (meth)acrylate-based adhesive composition used in the present invention is, for example, as follows. The components of a (meth)acrylate-based polymerizable oligomer, a (meth)acrylate-based polymerizable monomer, a (A) (meth)acrylate monomer, a (B) (meth)acrylate oligomer, an (C) acrylamide derivative, a (D) silane compound, an (E) organophosphorus compound, an initiator, a sensitizer, other additives, or the like are put into a container, mixed and dissolved at room temperature to 80° C., and optionally filtrated through a filter to obtain a desired adhesive composition. For preparing the adhesive composition, a known method is usable and is not limited to the above-described method. In consideration of the ease of application, it is preferable that the content ratio of each component of the adhesive composition used in the present invention is appropriately adjusted such that the adhesive composition has a viscosity of 1 to 5000 mPa at 25° C.

The (meth)acrylate-based adhesive composition used in the present invention may be applied by a known method such as use of an applicator, roll knife coat method, die coater method, roll coat method, bar coat method, gravure roll coat method, reverse roll coat method, dipping method, spray method, curtain flow method, screen coat method, or the like. The thickness of the adhesive is preferably 2 μm or greater and 200 μm or less.

The (meth)acrylate-based adhesive composition used in the present invention may be cured by visible light, ultraviolet (UV) or electron beam (EB). When the visible light or ultraviolet is used, a preferably used light source is, for example, low pressure mercury lamp, medium pressure mercury lamp, high pressure mercury lamp, super high pressure mercury lamp, xenon mercury lamp, xenon lamp, gallium lamp, metal halide lamp, quartz halogen lamp, tungsten lamp, ultraviolet fluorescent lamp, carbon arc lamp, electroless microwave system ultraviolet lamp, or the like.

A specific method of manufacturing an optically transparent electromagnetic wave shield laminate according to the present invention is, for example, as follows. A predetermined photocurable adhesive is applied to a polycarbonate resin sheet by a flow coater, and an electromagnetic wave shield layer having a polycarbonate resin film as a substrate is laminated thereon by a laminator such that the electromagnetic wave shield layer does not contain air bubbles. Then, the resultant assembly of layers is irradiated with a high pressure mercury lamp to cure the adhesive. Thus, the laminate is produced. In the case where three or more layers are laminated, an adhesive may be applied to each layer and irradiated with light, and then the plurality of layers may be laminated. Alternatively, an adhesive is provided between the plurality of layers and then the assembly of layers is irradiated with light to cure the adhesive, thus to produce the laminate. The laminate preferably has a thickness in the range of 0.1 to 30 mm, and more preferably in the range of 0.1 to 20 mm.

The optically transparent electromagnetic wave shield laminate according to the present invention may be bent under the following conditions. While a temperature difference between a top surface and a bottom surface of the shield laminate is controlled to be within 20° C., the shield laminate heated at a temperature of 130 to 185° C. (preferably 150 to 185° C.) for 30 seconds to 20 minutes is bent to have a curved shape having a radius of curvature of 10 mm or greater (preferably 15 to 2000 mm). According to a preferable embodiment of the present invention, a good optically transparent electromagnetic wave shield laminate which is not peeled off, foamed or whitened due to the deterioration or decomposition of the adhesive layer can be obtained. When the temperature difference between the top and bottom surfaces exceeds 20° C., the laminate is warped due to the difference in the thermal expansion. As a result, the layers are peeled off or the adhesive layer becomes wave-shaped, and thus the laminate becomes defective. In addition, since the stress strain remains, the layers are peeled off or cracked, or other faults occur, after being used for a long time. When the heating temperature is lower than 130° C., the polycarbonate resin substrate is not sufficiently softened, and therefore, a desired radius of curvature is not obtained due to springback. By contrast, when the heating temperature exceeds 185° C. (occasionally 165° C.), the adhesive force between the electromagnetic wave shield layer and the polycarbonate resin substrate (protecting layer) is lowered, and the layers are peeled off, which makes the laminate defective. When the radius of curvature is less than 10 mm, the laminate is excessively curved and is likely to be peeled off, which makes the laminate defective.

The polycarbonate resin laminate according to the present invention is bent under the following conditions. While a temperature difference between a top surface and a bottom surface of the polycarbonate resin laminate is controlled to be within 20° C., the polycarbonate resin laminate heated to a temperature of 130 to 185° C. (preferably 150 to 185° C.) is bent to have a curved shape having a radius of curvature of 10 mm or greater (preferably 15 to 2000 mm). The heating time is preferably 30 seconds to 20 min. According to a preferable embodiment of the present invention, a good polycarbonate resin laminate which is not peeled off, foamed or whitened due to the deterioration or decomposition of the adhesive layer can be obtained. When the temperature difference between the top and bottom surfaces exceeds 20° C., the laminate is warped due to the difference in the thermal expansion. As a result, the layers are peeled off or the adhesive layer becomes wave-shaped, and thus the laminate becomes defective. When the heating temperature is lower than 130° C., the polycarbonate resin substrate is not sufficiently softened, and therefore, a desired radius of curvature is not obtained due to springback. By contrast, when the heating temperature exceeds 185° C., the adhesive force between the polycarbonate resin substrates is lowered, and the layers are peeled off, which makes the laminate defective. When the radius of curvature is less than 10 mm, the laminate is excessively curved and is likely to be peeled off, which makes the laminate defective.

The polycarbonate resin laminate and the optically transparent electromagnetic wave shield laminate according to the present invention are each bent, for example, as follows. The laminate is heated to a predetermined temperature using rod-like heater heating, far-infrared heater heating, far-infrared lamp heating, high frequency heating, dielectric heating, induction heating, microwave heating, multi-stage press heating, electric oven heating, die heating or the like, and then is bent using a wooden die, a metal die or the like with which a predetermined radius of curvature is obtained. Alternatively, vacuum molding, press molding or the like is usable, but the method of bending is not limited to these methods.

In each of the polycarbonate resin laminate and the optically transparent electromagnetic wave shield laminate according to the present invention, at least one layer selected from the electromagnetic wave shield layer, the protecting layer and the adhesive layer which form the polycarbonate resin laminate or the optically transparent electromagnetic wave shield laminate preferably contains at least one of an ultraviolet absorber, a photostabilizer and an antioxidant. Such an agent is contained in order to prevent aging by hydrolysis or oxidation of the optically transparent organic polymer materials themselves contained in the laminate, to prevent deterioration by ultraviolet, or to improve the heat resistance and weather resistance under severe conditions of being exposed to sunlight or wind and rain, or the like. It is preferable that all the layers included in the polycarbonate resin laminate and the optically transparent electromagnetic wave shield laminate each contain at least one of an ultraviolet absorber, a photostabilizer and an antioxidant, but this is costly and not very economical because the ultraviolet absorber, the photostabilizer and the antioxidant are expensive. In consideration of the cost effectiveness, it is preferable to form a cover film containing at least one of the ultraviolet absorber, photostabilizer and antioxidant on one or both of surfaces of the polycarbonate resin laminate or the optically transparent electromagnetic wave shield laminate.

A cover film containing at least one of the ultraviolet absorber, photostabilizer and antioxidant is preferably formed of a silicone-based resin compound having a high durability against long-time use and a relatively high surface hardness, or an acrylic resin or a polyfunctional acrylic resin, which is relatively easy to be treated and provides a good cover film. The method for curing such a cover film varies in accordance with the properties of the resin compound used. In consideration of the productivity and convenience, it is preferable to select a thermosetting or photocurable resin. An example of the photocurable resin is a resin composition formed of a single or a plurality of types of resins such as mono-functional or polyfunctional acrylate monomer, oligomer or the like, to which a photoinitiator is added as a curing catalyst. Examples of the thermosetting resin include polyorganosiloxane-based resin, crosslinked acrylic-based resin, and the like. Such a resin composition is commercially available as a hard coat, and an appropriate type may be selected in consideration of the compatibility with the material of the cover film.

To such a cover film, in addition to the above-described ultraviolet absorber, photostabilizer, and antioxidant, various types of stabilizers such as organic solvent, anti-coloring agent and the like; leveling agent; defoaming agent; thickener; antistatic agent; surfactants such as antifogging agent and the like; etc. may be optionally added.

The cover film containing at least one of the ultraviolet absorber, photostabilizer and antioxidant may be formed on an acrylic resin layer laminated on the substrate by coextrusion of a substrate and an acrylic resin in order to improve the adhesiveness of the optically transparent electromagnetic wave shield laminate with the substrate.

An example of a photocurable acrylic-based resin compound used for forming the cover film is an ultraviolet-curable resin composition for cover film obtained by adding a photoinitiator at 1 to 10% by weight to a photopolymerizable compound formed of 20 to 80% by weight of 1,9-nonanediol diacrylate or tris(acroxyethyl)isocyanurate and 20 to 80% by weight of another compound copolymerizable therewith.

Examples of the compound copolymerizable with 1,9-nonanediol diacrylate or tris(acroxyethyl)isocyanurate used as indispensable components include at least bi-functional polyfunctional (meth)acrylate monomer, and at least bi-functional polyfunctional urethane (meth)acrylate oligomer (hereinafter, referred to as the "polyfunctional urethane (meth)acrylate oligomer"), at least bi-functional polyfunctional polyester (meth)acrylate oligomer (hereinafter, referred to as the "polyfunctional polyester (meth)acrylate oligomer"), at least bi-functional polyfunctional epoxy (meth)acrylate oligomer (hereinafter, referred to as the "polyfunctional epoxy (meth)acrylate oligomer") and the like. A single type of, or a combination of two or more types of, the (meth)acrylate monomer or oligomer is usable.

Representative examples of the bi-functional (meth)acrylate monomer include alkyleneglycol di(meth)acrylates, polyoxyalkyleneglycol di(meth)acrylates, halogen-substituted alkyleneglycol di(meth)acrylates, di(meth)acrylate of fatty acid polyol, alkylene oxide-adduct di(meth)acrylates of bisphenol A or bisphenol F, epoxy di(meth)acrylates of bisphenol A or bisphenol F, and the like. The bi-functional (meth)acrylate monomer is not limited to these, and various other materials are usable. Specific examples of the bi-functional (meth)acrylate monomer include 2-n-butyl-2-ethyl-1,3-propanediol diacrylate, tripropyleneglycol diacrylate, tetraethyleneglycol diacrylate, polyethyleneglycol di(meth)acrylate, polypropyleneglycol diacrylate, triethyleneglycol dimethacrylate, 1,6-hexanediol dimethacrylate, neopentylglycol dimethacrylate, and the like. Examples of the at least tri-functional (meth)acrylate monomer include trimethylolpropane trimethacrylate, trimethylolpropaneethylene oxide-adduct triacrylate, glycerinpropylene oxide-adduct triacrylate, pentaerythritol tetraacrylate, and the like.

An example of the polyfunctional urethane (meth)acrylate oligomer is a urethanization reaction product of a (meth)acrylate monomer having at least one (meth)acryloyloxy group and at least one hydroxyl group in one molecule and a polyisocyanate. An example of the polyfunctional urethane (meth)acrylate oligomer is a urethanization reaction product of an isocyanate compound obtained by reacting a polyol with polyisocyanate and a (meth)acrylate monomer having at least one (meth)acryloyloxy group and at least one hydroxyl group in one molecule.

Examples of the (meth)acrylate monomer having at least one (meth)acryloyloxy group and at least one hydroxyl group in one molecule, which is used for the urethanization reaction, include 2-hydroxyethyl (meth)acrylate, 2-hydroxypropyl (meth)acrylate, 2-hydroxybutyl (meth)acrylate, 2-hydroxy-3-phenoxypropyl (meth)acrylate, glycerin di(meth)acrylate, trimethylolpropane di(meth)acrylate, pentaerythritol tri(meth)acrylate, dipentaerythritol penta(meth)acrylate, and the like.

Examples of the polyisocyanate used for the urethanization reaction include di- or tri-isocyanate such as hexamethylene diisocyanate, lysine diisocyanate, isophorone diisocyanate, dicyclohexylmethane diisocyanate, tolylene diisocyanate, xylylene diisocyanate, diisocyanate (among these diisocyanates) obtained by adding hydrogen to aromatic isocyanate (e.g., diisocyanate such as hydrogen-added tolylene diisocyanate, hydrogen-added xylylene diisocyanate, or the like), triphenylmethane triisocyanate, dimethylenetriphenyl triisocyanate and the like; and polyisocyanate obtained by multimerization of diisocyanate.

Example of the polyol generally used for the urethanization reaction include aromatic, aliphatic and alicyclic polyols, and also polyester polyol, polyether polyol, and the like. Usually, examples of the aliphatic and alicyclic polyols include 1,4-butanediol, 1,6-hexanediol, neopentylglycol, ethyleneglycol, propyleneglycol, trimethylolethane, trimethylolpropane, dimethylolheptane, dimethylolpropionic acid, dimethylolbutylionic acid, glycerin, water-added bisphenol A, and the like.

Polyester polyol is obtained by dehydrogenation-condensation reaction of a polyol described above and a polybasic carboxylic acid (anhydride). Specific examples of the polybasic carboxylic acid include succinic acid (anhydride), adipic acid, maleic acid (anhydride), trimellitic acid (anhydride), hexahydrophthalic acid (anhydride), phthalic acid (anhydride), isophthalic acid, terephthalic acid, and the like. Examples of the polyether polyol include polyalkyleneglycol, and polyoxyalkylene-denatured polyol obtained by the reaction of a polyol or phenol with alkylene oxide.

The polyfunctional polyester (meth)acrylate oligomer is obtained by dehydrogenation-condensation reaction of a (meth)acrylic acid, a polybasic carboxylic acid (anhydride) and a polyol. Examples of the polybasic carboxylic acid (anhydride) used for the dehydrogenation-condensation reaction include succinic acid (anhydride), adipic acid, maleic acid (anhydride), itaconic acid (anhydride), trimellitic acid (anhydride), pyromellitic acid (anhydride), hexahydrophthalic acid (anhydride), phthalic acid (anhydride), isophthalic acid, terephthalic acid, and the like. Examples of the polyol used for the dehydrogenation-condensation reaction include 1,4-butanediol, 1,6-hexanediol, diethyleneglycol, triethyleneglycol, propyleneglycol, neopentylglycol, dimethylolheptane, dimethylolpropionic acid, dimethylolbutylionic acid, trimethylolpropane, ditrimethylolpropane, pentaerythritol, dipentaerythritol, and the like.

The polyfunctional epoxy (meth)acrylate oligomer is obtained by addition reaction of a polyglycidylether and a (meth)acrylic acid. Examples of the polyglycidylether include ethyleneglycoldiglycidylether, propyleneglycoldiglycidylether, tripropyleneglycoldiglycidylether, 1,6-hexanedioldiglycidylether, bisphenol A diglycidylether, and the like.

As the photoinitiator used for the cover film formed of a photocurable acrylic-based resin compound, any generally known photoinitiator is usable. Examples of such a photoinitiator include, but are not limited to, benzoin, benzophenone, benzomethylether, benzoinisopropylether, 2,2-dimethoxy-2-phenylacetophonone, 1-hydroxycyclohexylphenylketone, 2-hydroxy-2-methyl-1-phenylpropane-1-one, azobisisobutylonitrile, benzoylperoxide, and the like.

A specific example of the cover film formed of a thermosetting silicone-based resin compound is an organopolysiloxane-based resin compound containing at least one of epoxy-containing silane coupling agent and an amino-containing silane coupling agent. In more detail, a cured layer formed of an organopolysiloxane-based resin compound obtained as follows is an example of the cover film. A resin compound, formed of alkoxysilane containing 0 to 25% by weight of bi-functional alkoxysilane, 40 to 80% by weight of tri-functional alkoxysilane, and 10 to 25% by weight of tetra-functional alkoxysilane with respect to the nonvolatile content of the resin compound (JIS K6833), is mixed with 5 to 10% by weight of at least one of an epoxy-containing silane coupling agent and an amino-containing silane coupling agent; and this mixture is treated with hydrolysis and partial condensation in a solvent under the presence of an acid catalyst. Thus, the cured layer formed of an organopolysiloxane-based resin compound is obtained.

Examples of the bi-functional alkoxysilane used for forming the organopolysiloxane-based resin compound include dimethyldimethoxysilane, dimethyldiethoxysilane, diphenyldimethoxysilane, diphenyldiethoxysilane, and the like. Examples of the tri-functional alkoxysilane used for forming the organopolysiloxane-based resin compound include methyltrimethoxysilane, methyltriethoxysilane, ethyltrimethoxysilane, ethyltriethoxysilane, phenyltrimethoxysilane, phenyltriethoxysilane, and the like. Examples of the tetra-functional alkoxysilane used for forming the organopolysiloxane-based resin compound include tetramethoxysilane, tetraethoxysilane, tetrapropoxysilane, and the like.

The mixing ratios of the alkoxysilanes are preferably as follows: 0 to 25% by weight of the bi-functional alkoxysilane, 40 to 80% by weight of the tri-functional alkoxysilane, and 10 to 25% by weight of the tetra-functional alkoxysilane with respect to the nonvolatile content of the material applied for forming the cover film (JIS K6833). When the bi-functional alkoxysilane is contained at more than 25% by weight or the tri-functional alkoxysilane is contained at more than 80%, the abrasion resistance is lowered. When the tetra-functional alkoxysilane is contained at more than 30% by weight, the adhesiveness with the substrate is poor, whereas when the tetra-functional alkoxysilane is contained at less than 10% by weight, the abrasion resistance is lowered.

A preferable example of the silane coupling agent used for forming the organopolysiloxane-based resin compound is at least one of an epoxy-containing silane coupling agent and an amino-containing silane coupling agent. The silane coupling agent is used in the range of 5 to 10% by weight with respect to the nonvolatile content of the material applied for forming the cover film (JIS K6833). When the silane coupling agent is used at less than 5% by weight, the film properties and adhesiveness are lowered, whereas when the silane coupling agent is used at more than 10% by weight, the abrasion resistance is lowered.

Examples of the epoxy-containing silane coupling agent used for forming the organopolysiloxane-based resin compound include 3-glycidoxypropylmethyldimethoxysilane, 3-glycidoxypropyltrimethoxysilane, 2-(3,4-epoxycyclohexyl)ethyltrimethoxysilane, and the like. Examples of the amino-containing silane coupling agent used for forming the organopolysiloxane-based resin compound include N-(2-aminoethyl)-3-aminopropyl methyldimethoxysilane, N-(2-aminoethyl)-3-aminopropyltrimethoxysilane, 3-aminopropyltriethoxysilane, and the like.

The organopolysiloxane-based resin compound is produced by treating the mixture of the alkoxysilane and the silane coupling agent with hydrolysis and partial condensation using lower alcohol and/or water under the presence of an acid catalyst. As the lower alcohol, methanol, ethanol, isopropanol, butanol, or the like is usable.

Together with the organopolysiloxane-based resin compound, a vinyl-containing silane coupling agent such as vinyltrimethoxysilane, vinyltriethoxysilane or the like, or a methacryloxy-containing silane coupling agent such as 3-methacryloxypropylmethyldimethoxysilane, 3-methacryloxypropyltrimethoxysilane or the like is usable in such a range that the properties of the organopolysiloxane-based resin compound are not spoiled.

To the silane coupling agent-containing organopolysiloxane-based resin compound, it is preferable to add a curing catalyst provided with a buffer solution such that a cured film is obtained at a temperature of 120 to 140° C. Examples of the curing catalyst include dimethylamine, ethanolamine acetate, dimethylaniline formate, tetraethylammonium benzoate salt, sodium acetate, sodium propionate, sodium formate, benzoyltrimethylammonium acetate salt, tetramethylammonium acetate, and the like. The amount of the curing catalyst is in the range of 0.1 to 1% by weight with respect to the nonvolatile content of the resin compound.

In order to improve the adhesiveness of the cover film, used in the present invention, containing at least one of the ultraviolet absorber, the photostabilizer and the antioxidant, a primer layer may be formed. Examples of the compound used for forming the primer layer include acrylic group-containing organic compound, condensate of acrylic group-containing silane compound, condensate of alkoxysilyl group-containing vinyl-based compound, and the like. Examples of the acrylic group-containing compound include alkylacrylates such as methyl methacrylate, 2-hydroxyethyl methacrylate, butyl methacrylate, ethyl acrylate and the like, etc.

Examples of the acrylic group-containing silane compound include 3-methacryloxypropyltrimethoxysilane, 3-methacryloxypropyltriethoxysilane, 3-methacryloxypropylmethyldimethoxysilane, 3-methacryloxypropylmethyldiethoxysilane, 3-acryloxypropyltrimethoxysilane, 3-acryloxypropyltriethoxysilane, 3-acryloxypropylmethyldimethoxysilane, 3-acryl oxypropylmethyldiethoxysilane, 3-methacryloxymethyltrimethoxysilane, 3-methacryloxymethyltriethoxysilane, 3-methacryloxymethyl methyldimethoxysilane, 3-methacryloxymethylmethyldiethoxysilane, 3-acryloxymethyltrimethoxysilane, 3-acryloxymethyltriethoxysilane, 3-acryloxymethylmethyldimethoxysilane, 3-acryloxymethylmethyldiethoxysilane, and the like. Among these, 3-methacryloxypropyltrimethoxysilane, 3-methacryloxypropylmethyldimethoxysilane, 3-acryloxypropyltrimethoxysilane, and 3-acryloxypropylmethyldimethoxysilane are preferable in terms of ease of handling, crosslinking density, reactivity, and the like. Examples of the alkoxysilyl group-containing vinyl-based monomer include vinyltrimethoxysilane, vinyltriethoxysilane, vinyltris(2-methoxyethoxy)silane, vinylmethyldimethoxysilane, vinylmethyldiethoxysilane, vinylmethylbis(2-methoxyethoxy)silane, 3-vinyloxypropyltrimethoxysilane, 3-vinyloxypropyltriethoxysilane, 3-vinyloxypropylmethyldimethoxysilane, 3-vinyloxypropylmethyldiethoxysilane, stylyltrimethoxysilane, stylyltriethoxysilane, stylylmethyldimethoxysilane, stylylmethyldiethoxysilane, and the like. Among these, vinyltrimethoxysilane, vinyltriethoxysilane, and 3-vinyloxypropyltrimethoxysilane are preferable in terms of ease of handling, reactivity and the like.

According to the present invention, the cover film may be applied on the polycarbonate resin laminate by means of brush, roll, dipping, flow coating, spray, roll coater, flow coater or the like. The thickness of the cover film layer cured by thermal curing or photocuring is 1 to 20 μm, preferably 2 to 15 μm, and more preferably 3 to 12 μM. When the thickness of the cover film layer is less than 1 μm, the effects of improving the weather resistance and the surface hardness are likely to be insufficient, whereas a thickness exceeding 20 μm is disadvantageous in terms of cost and may lower the impact resistance.

EXAMPLES

Hereinafter, embodiments and effects of the present invention will be specifically described by way of examples and comparative examples. The present invention is not limited to these specific embodiments or examples in any way. The evaluation results described in the examples and the comparative examples were obtained by the following tests.
(Adhesive Force Test)

The adhesive force of a sample was measured in conformity to the 180 degree peel strength test of adhesiveness (JIS K6854-2) or the T-peel strength test of adhesiveness (JIS K6854-3). Specifically, polycarbonate resin sheets or films were bonded to each other with each of various adhesive compositions to produce a test piece having a width of 25 mm and a length of 200 mm. The peel strength [N/25 mm width] was measured by a tensile tester (AGS-100G produced by Shimadzu Corporation) at a peeling rate of 10 mm/min.
(Humidity Resistance Test)

A sample was put into a constant temperature and humidity chamber of 65° C. and 95% RH and cooled back to room temperature after being treated for 200 hours. The transparency was visually evaluated.
[Visual Evaluation]
O: Good transparency, no change
Δ: Slightly cloudy, visible
X: Cloudy, not visible
(Bendability Test)

Polycarbonate resin sheets or films were bonded to each other with each of various adhesive compositions to produce a test piece having a width of 25 mm and a length of 200 mm. The test piece was heated from above and below by a far-infrared heater. After the surface temperature of the test piece reached a predetermined temperature, the test piece was bent using a die having a predetermined radius of curvature. The radius of curvature and the bending state of the test piece were visually evaluated.
[External Appearance Evaluation]
O: No abnormality in the external appearance
X: Either peeled off, foamed, whitened, warped or wave-shaped
[Evaluation of the Radius of Curvature of the Test Piece]
O: Error is within 10% with respect to the radius of curvature of the die
Δ: Error is within 20% with respect to the radius of curvature of the die
X: Error is 20% or greater with respect to the radius of curvature of the die, or unmeasurable
(Method for Preparing an Adhesive)

The components of a (A) (meth)acrylate monomer, a (B) (meth)acrylate oligomer, an (C) acrylamide derivative, a (D) silane compound, an (E) organophosphorus compound, a photoinitiator and the like were put into a container at each of compositions shown in Table 1, and mixed and heated at 60°

C. for 1 hour. Thus, a desired adhesive composition was obtained. The components used for the adhesive composition are as follows.

[Components of the Adhesive Composition]

Urethane (meth)acrylate-based polymerizable oligomer: Dicyclohexylmethanediisocyanate-derived alicyclic hydrocarbon compound-containing urethane (meth)acrylate-based oligomer (Meth)acrylate-based polymerizable monomer: Isobornyl acrylate Acrylamide derivative: Dimethylacrylamide Silane compound: (3-(2,3-epoxypropoxy)propyl)trimethoxysilane Organophosphorus compound: Acrylate phosphate Photoinitiator: Irgacure 651

(Method for Producing a Polycarbonate Resin Laminate Using an Optically Transparent Adhesive)

Each of various adhesive compositions was applied on a polycarbonate resin sheet or film as a first layer by a bar coater, and a polycarbonate resin sheet or film as a second layer was laminated thereon by a laminator while being defoamed. This sample was irradiated with a high pressure mercury lamp (500 W) for 90 seconds and thus was sufficiently cured at a radiation amount of 1 J/cm². In the case where a polycarbonate resin sheet or film as a third layer was laminated, substantially the same method was used.

Each of the resultant samples was kept still in a constant temperature and humidity chamber (23° C., 50% RH) for 24 hours and then cut into a piece having a width of 50 mm and a length of 200 mm. This was used as a sample for evaluation.

[Materials]

PC sheet: Polycarbonate sheet (thickness: 1.5 mm to 20.0 mm) produced by MGC Filsheet Co., Ltd.

PC film: Polycarbonate film (thickness: 100 to 200 μm) produced by MGC Filsheet Co., Ltd.

(Method for Producing a Polycarbonate Resin Laminate Using a Hotmelt-Type Adhesive)

A hotmelt-type adhesive sheet was sandwiched between a polycarbonate resin sheet as a first layer (PC sheet; thickness: 3.0 mm) and a polycarbonate resin film as a second layer (PC film; thickness: 200 μm), and the assembly of layers was pressed at 135° C. for 30 minutes.

Each of the resultant samples was kept still in a constant temperature and humidity chamber (23° C., 50% RH) for 24 hours and then cut into a piece having a width of 50 mm and a length of 200 mm. This was used as a sample for evaluation.

[Hotmelt (HM)-Type Adhesive]

Ethylene vinyl acetate (EVA)-based HM-type adhesive: Elphan OH-501 produced by Nihon Matai, Co., Ltd.

Polyamide-based HM-type adhesive: Elphan NT-120 produced by Nihon Matai, Co., Ltd.

Polyurethane-based HM-type adhesive: Kurangile S-1700 produced by Kurabo Industries, Ltd.

Polyester-based HM-type adhesive: Kuranbetter G-6 produced by Kurabo Industries, Ltd.

Polyolefin-based HM-type adhesive: Kuranbetter A-1510 produced by Kurabo Industries, Ltd.

(Method for Producing a Polycarbonate Resin Laminate Using a Pressure-Sensitive Adhesive)

A pressure-sensitive adhesive sheet was sandwiched between a polycarbonate resin sheet as a first layer (PC sheet; thickness: 3.0 mm) and a polycarbonate resin film as a second layer (PC film; thickness: 200 μm), and the assembly of layers was pressed for 5 minutes.

Each of the resultant samples was kept still in a constant temperature and humidity chamber (23° C., 50% RH) for 24 hours and then cut into a piece having a width of 25 mm and a length of 200 mm. This was used as a sample for evaluation.

[Pressure-Sensitive Adhesive]

Acrylic-based pressure-sensitive adhesive sheet: CS-9621 produced by Nitto Denko Corporation Example 1

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organophosphorus compound, and 4.0% by weight of photoinitiator were put into a container, and an adhesive composition was prepared in accordance with the "method for preparing an adhesive" described above. The obtained adhesive composition was used for a polycarbonate resin first layer (PC sheet; thickness: 3.0 mm) and a polycarbonate resin second layer (PC film; thickness: 200 μm) to produce a sample in accordance with the "method for producing a polycarbonate resin laminate using an optically transparent adhesive" described above.

As a result of performing various evaluations, the following was found. In the "adhesive force test" described above, the sample had an adhesive force of 150 N. In the "humidity resistance test" described above, the sample exhibited a good result of not being clouded even after being treated for 200 hours. The "bendability test" described above was performed under the conditions of a surface temperature (top) of 160° C., a surface temperature (bottom) of 160° C., a surface temperature difference of 0° C., and a radius of curvature of the die of 25 mm. As a result, the external appearance was good, and the radius of curvature of the test piece was 25 mm.

Example 2

30.4% by weight of urethane (meth)acrylate-based polymerizable oligomer, 40.6% by weight of (meth)acrylate-based polymerizable monomer, 20.0% by weight of acrylamide derivative, 5.0% by weight of silane compound, and 4.0% by weight of photoinitiator were put into a container, and an adhesive composition was prepared in accordance with the "method for preparing an adhesive" described above. The obtained adhesive composition was used for a polycarbonate resin first layer (PC sheet; thickness: 3.0 mm) and a polycarbonate resin second layer (PC film; thickness: 200 μm) to produce a sample in accordance with the "method for producing a polycarbonate resin laminate using an optically transparent adhesive" described above.

As a result of performing various evaluations, the following was found. In the adhesive force test, the sample had an adhesive force of 70 N. In the humidity resistance test, the sample was not recognized as being changed even after being treated for 100 hours, and was slightly clouded after being treated for 200 hours. The bendability test was performed under the conditions of a surface temperature (top) of 160° C., a surface temperature (bottom) of 160° C., a surface temperature difference of 0° C., and a radius of curvature of the die of 25 mm. As a result, the external appearance was good, and the radius of curvature of the test piece was 25 mm.

Example 3

32.1% by weight of urethane (meth)acrylate-based polymerizable oligomer, 42.9% by weight of (meth)acrylate-based polymerizable monomer, 20.0% by weight of acrylamide derivative, 1.0% by weight of organophosphorus compound, and 4.0% by weight of photoinitiator were put into a container, and an adhesive composition was prepared in accordance with the "method for preparing an adhesive" described above. The obtained adhesive composition was used for a polycarbonate resin first layer (PC sheet; thickness: 3.0 mm) and a polycarbonate resin second layer (PC film; thickness: 200 μm) to produce a sample in accordance with the "method for producing a polycarbonate resin laminate using an optically transparent adhesive" described above.

As a result of performing various evaluations, the following was found. In the adhesive force test, the sample had an adhesive force of 85 N. In the humidity resistance test, the sample was not recognized as being clouded after being treated for 24 hours, and was slightly clouded after being treated for 100 hours. The bendability test was performed under the conditions of a surface temperature (top) of 160° C., a surface temperature (bottom) of 160° C., a surface temperature difference of 0° C., and a radius of curvature of the die of 25 mm. As a result, the external appearance was good, and the radius of curvature of the test piece was 25 mm.

Example 4

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organophosphorus compound, and 4.0% by weight of photoinitiator were put into a container, and an adhesive composition was prepared in accordance with the "method for preparing an adhesive" described above. The obtained adhesive composition was used for a polycarbonate resin first layer (PC sheet; thickness: 3.0 mm) and a polycarbonate resin second layer (PC film; thickness: 200 μm) to produce a sample in accordance with the "method for producing a polycarbonate resin laminate using an optically transparent adhesive" described above.

As a result of performing various evaluations, the following was found. In the adhesive force test, the sample had an adhesive force of 150 N. In the humidity resistance test, the sample exhibited a good result of not being clouded even after being treated for 200 hours. The bendability test was performed under the conditions of a surface temperature (top) of 130° C., a surface temperature (bottom) of 130° C., a surface temperature difference of 0° C., and a radius of curvature of the die of 25 mm. As a result, the external appearance was good, and the radius of curvature of the test piece was 29 mm.

Example 5

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organophosphorus compound, and 4.0% by weight of photoinitiator were put into a container, and an adhesive composition was prepared in accordance with the "method for preparing an adhesive" described above. The obtained adhesive composition was used for a polycarbonate resin first layer (PC sheet; thickness: 3.0 mm) and a polycarbonate resin second layer (PC film; thickness: 200 μm) to produce a sample in accordance with the "method for producing a polycarbonate resin laminate using an optically transparent adhesive" described above.

As a result of performing various evaluations, the following was found. In the adhesive force test, the sample had an adhesive force of 150 N. In the humidity resistance test, the sample exhibited a good result of not being clouded even after being treated for 200 hours. The bendability test was performed under the conditions of a surface temperature (top) of 165° C., a surface temperature (bottom) of 165° C., a surface temperature difference of 0° C., and a radius of curvature of the die of 25 mm. As a result, the external appearance was good, and the radius of curvature of the test piece was 25 mm.

Example 6

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organophosphorus compound, and 4.0% by weight of photoinitiator were put into a container, and an adhesive composition was prepared in accordance with the "method for preparing an adhesive" described above. The obtained adhesive composition was used for a polycarbonate resin first layer (PC sheet; thickness: 3.0 mm) and a polycarbonate resin second layer (PC film; thickness: 200 μm) to produce a sample in accordance with the "method for producing a polycarbonate resin laminate using an optically transparent adhesive" described above.

As a result of performing various evaluations, the following was found. In the adhesive force test, the sample had an adhesive force of 150 N. In the humidity resistance test, the sample exhibited a good result of not being clouded even after being treated for 200 hours. The bendability test was performed under the conditions of a surface temperature (top) of 185° C., a surface temperature (bottom) of 185° C., a surface temperature difference of 0° C., and a radius of curvature of the die of 25 mm. As a result, the external appearance was good, and the radius of curvature of the test piece was 25 mm.

Example 7

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organophosphorus compound, and 4.0% by weight of photoinitiator were put into a container, and an adhesive composition was prepared in accordance with the "method for preparing an adhesive" described above. The obtained adhesive composition was used for a polycarbonate resin first layer (PC sheet; thickness: 3.0 mm) and a polycarbonate resin second layer (PC film; thickness: 200 μm) to produce a sample in accordance with the "method for producing a polycarbonate resin laminate using an optically transparent adhesive" described above.

As a result of performing various evaluations, the following was found. In the adhesive force test, the sample had an adhesive force of 150 N. In the humidity resistance test, the sample exhibited a good result of not being clouded even after being treated for 200 hours. The bendability test was performed under the conditions of a surface temperature (top) of 160° C., a surface temperature (bottom) of 140° C., a surface temperature difference of 20° C., and a radius of curvature of the die of 25 mm. As a result, the external appearance was good, and the radius of curvature of the test piece was 25 mm.

Example 8

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organophosphorus compound, and 4.0% by weight of photoinitiator were put into a container, and an adhesive composition was prepared in accordance with the "method for preparing an adhesive" described above. The obtained adhesive composition was used for a polycarbonate resin first layer (PC sheet; thickness: 10.0 mm) and a polycarbonate resin second layer (PC film; thickness: 200 μm) to produce a sample in accordance with the "method for producing a polycarbonate resin laminate using an optically transparent adhesive" described above.

As a result of performing various evaluations, the following was found. In the adhesive force test, the sample had an adhesive force of 150 N. In the humidity resistance test, the sample exhibited a good result of not being clouded even after being treated for 200 hours. The bendability test was performed under the conditions of a surface temperature (top) of 160° C., a surface temperature (bottom) of 160° C., a surface temperature difference of 0° C., and a radius of curvature of the die of 50 mm. As a result, the external appearance was good, and the radius of curvature of the test piece was 51 mm.

Example 9

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organophosphorus compound, and 4.0% by weight of photoinitiator were put into a container, and an adhesive composition was prepared in accordance with the "method for preparing an adhesive" described above. The obtained adhesive composition was used for a polycarbonate resin first layer (PC sheet; thickness: 20.0 mm) and a polycarbonate resin second layer (PC film; thickness: 200 μm) to produce a sample in accordance with the "method for producing a polycarbonate resin laminate using an optically transparent adhesive" described above.

As a result of performing various evaluations, the following was found. In the adhesive force test, the sample had an adhesive force of 150 N. In the humidity resistance test, the sample exhibited a good result of not being clouded even after being treated for 200 hours. The bendability test was performed under the conditions of a surface temperature (top) of 160° C., a surface temperature (bottom) of 160° C., a surface temperature difference of 0° C., and a radius of curvature of the die of 100 mm. As a result, the external appearance was good, and the radius of curvature of the test piece was 105 mm.

Example 10

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organophosphorus compound, and 4.0% by weight of photoinitiator were put into a container, and an adhesive composition was prepared in accordance with the "method for preparing an adhesive" described above. The obtained adhesive composition was used for a polycarbonate resin first layer (PC sheet; thickness: 3.0 mm) and a polycarbonate resin second layer (PC film; thickness: 200 μm) to produce a sample in accordance with the "method for producing a polycarbonate resin laminate using an optically transparent adhesive" described above.

As a result of performing various evaluations, the following was found. In the adhesive force test, the sample had an adhesive force of 150 N. In the humidity resistance test, the sample exhibited a good result of not being clouded even after being treated for 200 hours. The bendability test was performed under the conditions of a surface temperature (top) of 160° C., a surface temperature (bottom) of 160° C., a surface temperature difference of 0° C., and a radius of curvature of the die of 10 mm. As a result, the external appearance was good, and the radius of curvature of the test piece was 11 mm.

Example 11

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organophosphorus compound, and 4.0% by weight of photoinitiator were put into a container, and an adhesive composition was prepared in accordance with the "method for preparing an adhesive" described above. The obtained adhesive composition was used for a polycarbonate resin second layer (PC film; thickness: 200 μm) and polycarbonate resin first and third layers (PC sheet; thickness: 1.5 mm each) provided above and below the second layer to produce a sample in accordance with the "method for producing a polycarbonate resin laminate using an optically transparent adhesive" described above.

As a result of performing various evaluations, the following was found. In the adhesive force test, the sample had an adhesive force of 150 N. In the humidity resistance test, the sample exhibited a good result of not being clouded even after being treated for 200 hours. The bendability test was performed under the conditions of a surface temperature (top) of 160° C., a surface temperature (bottom) of 160° C., a surface temperature difference of 0° C., and a radius of curvature of the die of 25 mm. As a result, the external appearance was good, and the radius of curvature of the test piece was 26 mm.

Comparative Example 1

41.1% by weight of urethane (meth)acrylate-based polymerizable oligomer, 54.9% by weight of (meth)acrylate-based polymerizable monomer, and 4.0% by weight of photoinitiator were put into a container, and an adhesive composition was prepared in accordance with the "method for preparing an adhesive" described above. The obtained adhesive composition was used for a polycarbonate resin first layer (PC sheet; thickness: 3.0 mm) and a polycarbonate resin second layer (PC film; thickness: 200 μm) to produce a sample in accordance with the "method for producing a polycarbonate resin laminate using an optically transparent adhesive" described above.

As a result of performing various evaluations, the following was found. In the adhesive force test, the sample had an adhesive force of 1 N. In the humidity resistance test, the sample was clouded after being treated for 24 hours. The bendability test was performed under the conditions of a surface temperature (top) of 160° C., a surface temperature (bottom) of 160° C., a surface temperature difference of 0° C., and a radius of curvature of the die of 25 mm. As a result, peel-off occurred.

Comparative Example 2

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organophosphorus compound, and 4.0% by weight of photoinitiator were put into a container, and an adhesive composition was prepared in accordance with the "method for preparing an adhesive" described above. The obtained adhesive composition was used for a polycarbonate resin first layer (PC sheet; thickness: 3.0 mm) and a polycarbonate resin second layer (PC film; thickness: 200 μm) to produce a sample in accordance with the "method for producing a polycarbonate resin laminate using an optically transparent adhesive" described above.

As a result of performing various evaluations, the following was found. In the adhesive force test, the sample had an adhesive force of 150 N. In the humidity resistance test, the sample exhibited a good result of not being clouded even after being treated for 200 hours. The bendability test was performed under the conditions of a surface temperature (top) of 190° C., a surface temperature (bottom) of 190° C., a surface temperature difference of 0° C., and a radius of curvature of the die of 25 mm. As a result, the adhesive layer became wave-shaped, and the radius of curvature of the test piece was 25 mm.

Comparative Example 3

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organophosphorus compound, and 4.0% by weight of photoinitiator were put into a container, and an adhesive composition was prepared in accordance with the "method for preparing an adhesive" described above. The obtained adhesive composition was used for a polycarbonate resin first layer (PC sheet; thickness: 3.0 mm) and a polycarbonate resin second layer (PC film; thickness: 200 μm) to produce a sample in accordance with the "method for producing a polycarbonate resin laminate using an optically transparent adhesive" described above.

As a result of performing various evaluations, the following was found. In the adhesive force test, the sample had an adhesive force of 150 N. In the humidity resistance test, the sample exhibited a good result of not being clouded even after being treated for 200 hours. The bendability test was performed under the conditions of a surface temperature (top) of 170° C., a surface temperature (bottom) of 140° C., a surface temperature difference of 30° C., and a radius of curvature of the die of 25 mm. As a result, the external shape was warped, and the radius of curvature of the test piece was 25 mm.

Comparative Example 4

A visible-light curable adhesive (BENEFIX PC produced by Adell Corporation) was used for a polycarbonate resin first layer (PC sheet; thickness: 3.0 mm) and a polycarbonate resin second layer (PC film; thickness: 200 μm) to produce a sample in accordance with the "method for producing a polycarbonate resin laminate using an optically transparent adhesive" described above. The adhesive was cured using a visible-light fluorescent lamp as the light source.

As a result of performing various evaluations, the following was found. In the adhesive force test, the sample had an adhesive force of 30 N, at which the PC film was ruptured. In the humidity resistance test, the sample was clouded after being treated for 24 hours. The bendability test was performed under the conditions of a surface temperature (top) of 160° C., a surface temperature (bottom) of 160° C., a surface temperature difference of 0° C., and a radius of curvature of the die of 25 mm. As a result, the external appearance was good, and the radius of curvature of the test piece was 26 mm.

Comparative Example 5

An ethylene vinyl acetate (EVA)-based hotmelt-type adhesive was sandwiched between a polycarbonate resin first layer (PC sheet; thickness: 3.0 mm) and a polycarbonate resin second layer (PC film; thickness: 200 μm) to produce a sample in accordance with the "method for producing an optically transparent electromagnetic wave shield laminate using a hotmelt-type adhesive" described above.

As a result of performing various evaluations, the following was found. In the adhesive force test, the sample had an adhesive force of 7 N. In the humidity resistance test, the sample was clouded after being treated for 24 hours. The bendability test was performed under the conditions of a surface temperature (top) of 160° C., a surface temperature (bottom) of 160° C., a surface temperature difference of 0° C., and a radius of curvature of the die of 25 mm. As a result, the adhesive layer was air-bubbled, and peel-off occurred.

Comparative Example 6

A polyamide-based hotmelt-type adhesive was sandwiched between a polycarbonate resin first layer (PC sheet; thickness: 3.0 mm) and a polycarbonate resin second layer (PC film; thickness: 200 μm) to produce a sample in accordance with the "method for producing an optically transparent electromagnetic wave shield laminate using a hotmelt-type adhesive" described above.

As a result of performing various evaluations, the following was found. In the adhesive force test, the sample had an adhesive force of 2 N. In the humidity resistance test, the sample was clouded after being treated for 100 hours. The bendability test was performed under the conditions of a surface temperature (top) of 160° C., a surface temperature (bottom) of 160° C., a surface temperature difference of 0° C., and a radius of curvature of the die of 25 mm. As a result, peel-off occurred.

Comparative Example 7

A polyurethane-based hotmelt-type adhesive was sandwiched between a polycarbonate resin first layer (PC sheet; thickness: 3.0 mm) and a polycarbonate resin second layer (PC film; thickness: 200 μm) to produce a sample in accordance with the "method for producing an optically transparent electromagnetic wave shield laminate using a hotmelt-type adhesive" described above.

As a result of performing various evaluations, the following was found. In the adhesive force test, the sample had an adhesive force of 92 N. In the humidity resistance test, the sample was clouded after being treated for 24 hours. The bendability test was performed under the conditions of a surface temperature (top) of 160° C., a surface temperature (bottom) of 160° C., a surface temperature difference of 0° C., and a radius of curvature of the die of 25 mm. As a result, the adhesive layer was whitened and the visibility was lost.

Comparative Example 8

A polyester-based hotmelt-type adhesive was sandwiched between a polycarbonate resin first layer (PC sheet; thickness: 3.0 mm) and a polycarbonate resin second layer (PC film; thickness: 200 μm) to produce a sample in accordance with the "method for producing an optically transparent electromagnetic wave shield laminate using a hotmelt-type adhesive" described above.

As a result of performing various evaluations, the following was found. In the adhesive force test, the sample had an adhesive force of 107 N. In the humidity resistance test, the sample was clouded after being treated for 24 hours. The bendability test was performed under the conditions of a surface temperature (top) of 160° C., a surface temperature (bottom) of 160° C., a surface temperature difference of 0° C., and a radius of curvature of the die of 25 mm. As a result, the adhesive layer was recognized as being foamed, and peel-off occurred.

Comparative Example 9

A polyolefin-based hotmelt-type adhesive was sandwiched between a polycarbonate resin first layer (PC sheet; thickness: 3.0 mm) and a polycarbonate resin second layer (PC film; thickness: 200 μm) to produce a sample in accordance with the "method for producing an optically transparent electromagnetic wave shield laminate using a hotmelt-type adhesive" described above.

As a result of performing various evaluations, the following was found. In the adhesive force test, the sample had an adhesive force of 3 N. In the humidity resistance test, the sample was clouded after being treated for 100 hours. The bendability test was performed under the conditions of a surface temperature (top) of 160° C., a surface temperature (bottom) of 160° C., a surface temperature difference of 0° C., and a radius of curvature of the die of 25 mm. As a result, peel-off occurred.

Comparative Example 10

An acrylic-based pressure-sensitive adhesive sheet was sandwiched between a polycarbonate resin first layer (PC sheet; thickness: 3.0 mm) and a polycarbonate resin second layer (PC film; thickness: 200 μm) to produce a sample in accordance with the "method for producing an optically transparent electromagnetic wave shield laminate using a pressure-sensitive adhesive" described above.

As a result of performing various evaluations, the following was found. In the adhesive force test, the sample had an adhesive force of 6 N. In the humidity resistance test, the sample was clouded after being treated for 100 hours. The bendability test was performed under the conditions of a surface temperature (top) of 160° C., a surface temperature (bottom) of 160° C., a surface temperature difference of 0° C., and a radius of curvature of the die of 25 mm. As a result, the adhesive layer was foamed, and peel-off occurred.

TABLE 1

| | Adhesive type | | (Meth)acrylate adhesive composition [% by weight] | | | | | |
|---|---|---|---|---|---|---|---|---|
| | Curing method | Main component | Urethane (meth)acrylate polymerizable oligomer | (Meth)acrylate polymerizable monomer | Acrylamide derivative | Silane compound | Organo-phosphorus compound | Photo-initiator |
| Ex. 1 | Photocurable adhesive | Acrylic-based | 30.0 | 40.0 | 20.0 | 5.0 | 1.0 | 4.0 |
| Ex. 2 | Photocurable adhesive | Acrylic-based | 30.4 | 40.6 | 20.0 | 5.0 | | 4.0 |
| Ex. 3 | Photocurable adhesive | Acrylic-based | 32.1 | 42.9 | 20.0 | | 1.0 | 4.0 |
| Ex. 4 | Photocurable adhesive | Acrylic-based | 30.0 | 40.0 | 20.0 | 5.0 | 1.0 | 4.0 |
| Ex. 5 | Photocurable adhesive | Acrylic-based | 30.0 | 40.0 | 20.0 | 5.0 | 1.0 | 4.0 |
| Ex. 6 | Photocurable adhesive | Acrylic-based | 30.0 | 40.0 | 20.0 | 5.0 | 1.0 | 4.0 |
| Ex. 7 | Photocurable adhesive | Acrylic-based | 30.0 | 40.0 | 20.0 | 5.0 | 1.0 | 4.0 |
| Ex. 8 | Photocurable adhesive | Acrylic-based | 30.0 | 40.0 | 20.0 | 5.0 | 1.0 | 4.0 |
| Ex. 9 | Photocurable adhesive | Acrylic-based | 30.0 | 40.0 | 20.0 | 5.0 | 1.0 | 4.0 |
| Ex. 10 | Photocurable adhesive | Acrylic-based | 30.0 | 40.0 | 20.0 | 5.0 | 1.0 | 4.0 |
| Ex. 11 | Photocurable adhesive | Acrylic-based | 30.0 | 40.0 | 20.0 | 5.0 | 1.0 | 4.0 |
| Comparative ex. 1 | Photocurable adhesive | Acrylic-based | 41.1 | 54.9 | | | | 4.0 |
| Comparative ex. 2 | Photocurable adhesive | Acrylic-based | 30.0 | 40.0 | 20.0 | 5.0 | 1.0 | 4.0 |
| Comparative ex. 3 | Photocurable adhesive | Acrylic-based | 30.0 | 40.0 | 20.0 | 5.0 | 1.0 | 4.0 |
| Comparative ex. 4 | Visible-light curable adhesive (Adell) | Acrylic-based | | | | | | |
| Comparative ex. 5 | Hot melt-type adhesive | EVA-based | | | | | | |
| Comparative ex. 6 | Hot melt-type adhesive | Polyamide-based | | | | | | |
| Comparative ex. 7 | Hot melt-type adhesive | Polyurethane-based | | | | | | |
| Comparative ex. 8 | Hot melt-type adhesive | Polyester-based | | | | | | |
| Comparative ex. 9 | Hot melt-type adhesive | Polyolefin-based | | | | | | |
| Comparative ex. 10 | Pressure-sensitive adhesive | Acrylic-based | | | | | | |

| | Polycarbonate resin laminate structure Film or sheet substrate (thickness[mm]) | | |
|---|---|---|---|
| | 1st layer | 2nd layer | 3rd layer |
| Ex. 1 | PC (3.0) | PC (0.2) | |
| Ex. 2 | PC (3.0) | PC (0.2) | |
| Ex. 3 | PC (3.0) | PC (0.2) | |

TABLE 1-continued

|  |  |  |  |
|---|---|---|---|
| Ex. 4 | PC (3.0) | PC (0.2) | |
| Ex. 5 | PC (3.0) | PC (0.2) | |
| Ex. 6 | PC (3.0) | PC (0.2) | |
| Ex. 7 | PC (3.0) | PC (0.2) | |
| Ex. 8 | PC (10.0) | PC (0.2) | |
| Ex. 9 | PC (20.0) | PC (0.2) | |
| Ex. 10 | PC (3.0) | PC (0.2) | |
| Ex. 11 | PC (1.5) | PC (0.2) | PC (1.5) |
| Comparative ex. 1 | PC (3.0) | PC (0.2) | |
| Comparative ex. 2 | PC (3.0) | PC (0.2) | |
| Comparative ex. 3 | PC (3.0) | PC (0.2) | |
| Comparative ex. 4 | PC (3.0) | PC (0.2) | |
| Comparative ex. 5 | PC (3.0) | PC (0.2) | |
| Comparative ex. 6 | PC (3.0) | PC (0.2) | |
| Comparative ex. 7 | PC (3.0) | PC (0.2) | |
| Comparative ex. 8 | PC (3.0) | PC (0.2) | |
| Comparative ex. 9 | PC (3.0) | PC (0.2) | |
| Comparative ex. 10 | PC (3.0) | PC (0.2) | |

TABLE 2

| | Adhesive type | | Bending conditions | | | Radius of curvature of die [mm] | Adhesive force test T-peel strength test [N/25 mm] | Humidity resistance test 65° C.-95% RH | | |
|---|---|---|---|---|---|---|---|---|---|---|
| | | | Heating temperature [° C.] | | | | | | | |
| | Curing method | Main component | Top surface temperature | Bottom surface temperature | Surface temperature difference | | | 24 h | 100 h | 200 h |
| Ex. 1 | Photocurable adhesive | Acrylic-based | 160 | 160 | 0 | 25 | 150 | ○ | ○ | ○ |
| Ex. 2 | Photocurable adhesive | Acrylic-based | 160 | 160 | 0 | 25 | 70 | ○ | ○ | Δ |
| Ex. 3 | Photocurable adhesive | Acrylic-based | 160 | 160 | 0 | 25 | 85 | ○ | Δ | X |
| Ex. 4 | Photocurable adhesive | Acrylic-based | 130 | 130 | 0 | 25 | 150 | ○ | ○ | ○ |
| Ex. 5 | Photocurable adhesive | Acrylic-based | 165 | 165 | 0 | 25 | 150 | ○ | ○ | ○ |
| Ex. 6 | Photocurable adhesive | Acrylic-based | 185 | 185 | 0 | 25 | 150 | ○ | ○ | ○ |
| Ex. 7 | Photocurable adhesive | Acrylic-based | 160 | 140 | 20 | 25 | 150 | ○ | ○ | ○ |
| Ex. 8 | Photocurable adhesive | Acrylic-based | 160 | 160 | 0 | 50 | 150 | ○ | ○ | ○ |
| Ex. 9 | Photocurable adhesive | Acrylic-based | 160 | 160 | 0 | 100 | 150 | ○ | ○ | ○ |
| Ex. 10 | Photocurable adhesive | Acrylic-based | 160 | 160 | 0 | 10 | 150 | ○ | ○ | ○ |
| Ex. 11 | Photocurable adhesive | Acrylic-based | 160 | 160 | 0 | 25 | 150 | ○ | ○ | ○ |
| Comparative ex. 1 | Photocurable adhesive | Acrylic-based | 160 | 160 | 0 | 25 | 1 | X | X | X |
| Comparative ex. 2 | Photocurable adhesive | Acrylic-based | 190 | 190 | 0 | 25 | 150 | ○ | ○ | ○ |
| Comparative ex. 3 | Photocurable adhesive | Acrylic-based | 170 | 140 | 30 | 25 | 150 | ○ | ○ | ○ |
| Comparative ex. 4 | Visible-light curable adhesive (Adell) | Acrylic-based | 160 | 160 | 0 | 25 | 30(PC ruptured) | X | X | X |
| Comparative ex. 5 | Hot melt-type adhesive | EVA-based | 160 | 160 | 0 | 25 | 7 | X | X | X |
| Comparative ex. 6 | Hot melt-type adhesive | Polyamide-based | 160 | 160 | 0 | 25 | 2 | ○ | X | X |

TABLE 2-continued

| | | | | | | | | | |
|---|---|---|---|---|---|---|---|---|---|
| Comparative ex. 7 | Hot melt-type adhesive | Polyurethane-based | 160 | 160 | 0 | 25 | 92 | X | X | X |
| Comparative ex. 8 | Hot melt-type adhesive | Polyester-based | 160 | 160 | 0 | 25 | 107 | X | X | X |
| Comparative ex. 9 | Hot melt-type adhesive | Polyolefin-based | 160 | 160 | 0 | 25 | 3 | ◯ | X | X |
| Comparative ex. 10 | Pressure-sensitive adhesive | Acrylic-based | 160 | 160 | 0 | 25 | 6 | ◯ | X | X |

| | Bendability test | |
|---|---|---|
| | External appearance | Radius of curvature of test piece [mm] |
| Ex. 1 | ◯ | 25(◯) |
| Ex. 2 | ◯ | 25(◯) |
| Ex. 3 | ◯ | 25(◯) |
| Ex. 4 | ◯ | 29(Δ) |
| Ex. 5 | ◯ | 25(◯) |
| Ex. 6 | ◯ | 25(◯) |
| Ex. 7 | ◯ | 25(◯) |
| Ex. 8 | ◯ | 51(◯) |
| Ex. 9 | ◯ | 105(◯) |
| Ex. 10 | ◯ | 11(◯) |
| Ex. 11 | ◯ | 26(◯) |
| Comparative ex. 1 | X peeled off | Unmeasurable (X) |
| Comparative ex. 2 | X wave-shaped | 25(◯) |
| Comparative ex. 3 | X warped | 25(◯) |
| Comparative ex. 4 | ◯ | 26(◯) |
| Comparative ex. 5 | X peeled off/foamed | Unmeasurable (X) |
| Comparative ex. 6 | X peeled off | Unmeasurable (X) |
| Comparative ex. 7 | X whitened | 26(◯) |
| Comparative ex. 8 | X peeled off/foamed | Unmeasurable (X) |
| Comparative ex. 9 | X peeled off | Unmeasurable (X) |
| Comparative ex. 10 | X peeled off/foamed | Unmeasurable (X) |

(Electromagnetic Wave Shield Performance Test)

The electromagnetic wave shield performance in a frequency range of 100 MHz to 1 GHz was measured using an electromagnetic wave shield performance measuring device (produced by Advantest Corporation).
[Electromagnetic Wave Shield Performance Evaluation]

A sample exhibiting an electromagnetic wave shield performance of 30 dB or greater at the frequencies of 100 MHz and 1 GHz was evaluated as good (O), and a sample exhibiting an electromagnetic wave shield performance of less than 30 dB at the frequencies of 100 MHz and 1 GHz was evaluated as poor (X).

(Adhesive Force Test)

The adhesive force of a sample was measured in conformity to the 180 degree peel strength test of adhesiveness (JIS K6854-2). Specifically, an electromagnetic wave shield layer (PC film, PET film) and a protecting layer (PC sheet or film) were bonded to each other with each of various adhesive compositions to produce a test piece having a width of 25 mm and a length of 200 mm. The peel strength [N/25 mm width] was measured by a tensile tester at a peeling rate of 10 mm/min. The adhesive forces of the adhesive with the electromagnetic wave shield layer and the protecting layer (top and bottom surfaces) were measured, and a smaller value was shown in each of the examples and the comparative examples.

(Bendability Test)

An electromagnetic wave shield layer (PC film, PET film) and a protecting layer were bonded to each other with each of various adhesive compositions to produce a test piece having a width of 50 mm and a length of 200 mm. The test piece was heated from above and below by a far-infrared heater. After the surface temperature of the test piece reached a predetermined temperature, the test piece was bent using a die having a predetermined radius of curvature. The radius of curvature and the bending state of the test piece were visually evaluated.
[External Appearance Evaluation]
O: No abnormality in the external appearance
X: Either peeled off, foamed, whitened, warped or wave-shaped
[Evaluation of the Radius of Curvature of the Test Piece]
O: Error is within 10% with respect to the radius of curvature of the die
Δ: Error is within 20% with respect to the radius of curvature of the die
X: Error is 20% or greater with respect to the radius of curvature of the die, or unmeasurable (Method for Preparing an Adhesive)

The components of a (A) (meth)acrylate monomer, a (B) (meth)acrylate oligomer, an (C) acrylamide derivative, a (D) silane compound, an (E) organophosphorus compound, a photoinitiator and the like were put into a container at each of compositions shown in Tables 3 and 4, and mixed and heated at 60° C. for 1 hour. Thus, a desired adhesive composition was obtained. The components used for the adhesive composition are as follows.

[Components of the Adhesive Composition]
Urethane (meth)acrylate-based polymerizable oligomer: Dicyclohexylmethanediisocyanate-derived alicyclic hydrocarbon compound-containing urethane (meth) acrylate-based oligomer
(Meth)acrylate-based polymerizable monomer: Isobornyl acrylate
Acrylamide derivative: Dimethylacrylamide
Silane compound: (3-(2,3-epoxypropoxy)propyl)trimethoxysilane
Organophosphorus compound: Acrylate phosphate
Photoinitiator: Irgacure 651

(Method for Producing an Optically Transparent Electromagnetic Wave Shield Laminate Using an Optically Transparent Adhesive)

Each of various adhesive compositions was applied on a protecting layer (PC sheet or film) by a bar coater, and an electromagnetic wave shield layer (PC film, PET film) was laminated thereon by a laminator while being defoamed. This sample was irradiated with a high pressure mercury lamp (500 W) for 90 seconds and thus was sufficiently cured at a radiation amount of 1 J/cm². In the case where the protecting layer was laminated on both surfaces of the electromagnetic wave shield layer, substantially the same method was used.

Each of the resultant samples was kept still in a constant temperature and humidity chamber (23° C., 50% RH) for 24 hours and then cut into a piece having a width of 50 mm and a length of 200 mm. This was used as a sample for evaluation.

[Materials]
(Electromagnetic Wave Shield Layer)
A PC film or a PET film produced as a mesh using each of various conductive compounds and having a surface resistance value of 1[Ω/□] or less
(Conductive Compound Mesh)
AgC conductive printed mesh: Line: 100 µm; pitch: 500 µm; surface resistance: 0.5Ω/□
Copper compound thin film mesh: Line: 10 µm; pitch: 300 µm; surface resistance: 0.1Ω/□
Silver compound thin film mesh: Line: 10 µm; pitch: 180 µm; surface resistance: 0.1Ω/□
(Base Substrate)
PC film: Polycarbonate film (thickness: 100 to 200 µm) produced by MGC Filsheet Co., Ltd.
PET film: Easily adhesive polyethylene terephthalate (thickness: 200 µm) produced by Toyobo Co., Ltd.
(Protecting Layer)
PC sheet: Polycarbonate sheet (thickness: 1.5 mm to 20.0 mm) produced by MGC Filsheet Co., Ltd.
PC film: Polycarbonate film (thickness: 100 µm) produced by MGC Filsheet Co., Ltd.

(Method for Producing an Optically Transparent Electromagnetic Wave Shield Laminate Using a Hotmelt-Type Adhesive)

A hotmelt-type adhesive sheet was sandwiched between an electromagnetic wave shield layer (PC film; thickness: 200 µm) and a protecting layer (PC sheet; thickness: 3.0 mm), and the assembly of layers was pressed at 135° C. for 30 minutes.

Each of the resultant samples was kept still in a constant temperature and humidity chamber (23° C., 50% RH) for 24 hours and then cut into a piece having a width of 50 mm and a length of 200 mm. This was used as a sample for evaluation.

[Hotmelt (HM)-Type Adhesive]
Ethylene vinyl acetate (EVA)-based HM-type adhesive: Elphan OH-501 produced by Nihon Matai, Co., Ltd.
Polyamide-based HM-type adhesive: Elphan NT-120 produced by Nihon Matai, Co., Ltd.
Polyurethane-based HM-type adhesive: Kurangile S-1700 produced by Kurabo Industries, Ltd.
Polyester-based HM-type adhesive: Kuranbetter G-6 produced by Kurabo Industries, Ltd.
Polyolefin-based HM-type adhesive: Kuranbetter A-1510 produced by Kurabo Industries, Ltd.

(Method for Producing an Optically Transparent Electromagnetic Wave Shield Laminate Using a Pressure-Sensitive Adhesive)

A pressure-sensitive adhesive sheet was sandwiched between an electromagnetic wave shield layer (PC film; thickness: 200 µm) and a protecting layer (PC sheet; thickness: 3.0 mm), and the assembly of layers was pressed for 5 minutes.

Each of the resultant samples was kept still in a constant temperature and humidity chamber (23° C., 50% RH) for 24 hours and then cut into a piece having a width of 25 mm and a length of 200 mm. This was used as a sample for evaluation.

[Pressure-Sensitive Adhesive]
Acrylic-based pressure-sensitive adhesive sheet: CS-9621 produced by Nitto Denko Corporation Example 12

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organophosphorus compound, and 4.0% by weight of photoinitiator were put into a container, and an adhesive composition was prepared in accordance with the "method for preparing an adhesive" described above. The obtained adhesive composition was used for an electromagnetic wave shield layer of the copper compound thin film mesh (PC film; thickness: 200 µm) and a protecting layer (PC sheet; thickness: 3.0 mm) to produce a sample in accordance with the "method for producing an optically transparent electromagnetic wave shield laminate using an optically transparent adhesive" described above.

As a result of performing various evaluations, the following was found. In the "electromagnetic wave shield performance test" described above, the sample exhibited a good electromagnetic wave shield performance. In the "adhesive force test" described above, the sample had an adhesive force of 115 N. The "bendability test" described above was performed under the conditions of a surface temperature (top) of 165° C., a surface temperature (bottom) of 165° C., a surface temperature difference of 0° C., and a radius of curvature of the die of 25 mm. As a result, the external appearance was good, and the radius of curvature of the test piece was 25 mm.

Example 13

30.4% by weight of urethane (meth)acrylate-based polymerizable oligomer, 40.8% by weight of (meth)acrylate-based polymerizable monomer, 20.0% by weight of acrylamide derivative, 5.0% by weight of silane compound, and 4.0% by weight of photoinitiator were put into a container, and an adhesive composition was prepared in accordance with the "method for preparing an adhesive" described above. The obtained adhesive composition was used for an electromagnetic wave shield layer of the copper compound thin film mesh (PC film; thickness: 200 μm) and a protecting layer (PC sheet; thickness: 3.0 mm) to produce a sample in accordance with the "method for producing an optically transparent electromagnetic wave shield laminate using an optically transparent adhesive" described above.

Various evaluations were performed in substantially the same manner as in Example 12. In the electromagnetic wave shield performance test, the sample exhibited a good electromagnetic wave shield performance. In the adhesive force test, the sample had an adhesive force of 70 N. The bendability test was performed under the conditions of a surface temperature (top) of 165° C., a surface temperature (bottom) of 165° C., a surface temperature difference of 0° C., and a radius of curvature of the die of 25 mm. As a result, the external appearance was good, and the radius of curvature of the test piece was 25 mm.

Example 14

32.1% by weight of urethane (meth)acrylate-based polymerizable oligomer, 42.9% by weight of (meth)acrylate-based polymerizable monomer, 20.0% by weight of acrylamide derivative, 1.0% by weight of organophosphorus compound, and 4.0% by weight of photoinitiator were put into a container, and an adhesive composition was prepared in accordance with the "method for preparing an adhesive" described above. The obtained adhesive composition was used for an electromagnetic wave shield layer of the copper compound thin film mesh (PC film; thickness: 200 μm) and a protecting layer (PC sheet; thickness: 3.0 mm) to produce a sample in accordance with the "method for producing an optically transparent electromagnetic wave shield laminate using an optically transparent adhesive" described above.

Various evaluations were performed in substantially the same manner as in Example 12. In the electromagnetic wave shield performance test, the sample exhibited a good electromagnetic wave shield performance. In the adhesive force test, the sample had an adhesive force of 86 N. The bendability test was performed under the conditions of a surface temperature (top) of 165° C., a surface temperature (bottom) of 165° C., a surface temperature difference of 0° C., and a radius of curvature of the die of 25 mm. As a result, the external appearance was good, and the radius of curvature of the test piece was 25 mm.

Example 15

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organophosphorus compound, and 4.0% by weight of photoinitiator were put into a container, and an adhesive composition was prepared in accordance with the "method for preparing an adhesive" described above. The obtained adhesive composition was used for an electromagnetic wave shield layer of the copper compound thin film mesh (PC film; thickness: 200 μm) and a protecting layer (PC sheet; thickness: 3.0 mm) to produce a sample in accordance with the "method for producing an optically transparent electromagnetic wave shield laminate using an optically transparent adhesive" described above.

Various evaluations were performed in substantially the same manner as in Example 12. In the electromagnetic wave shield performance test, the sample exhibited a good electromagnetic wave shield performance. In the adhesive force test, the sample had an adhesive force of 115 N. The bendability test was performed under the conditions of a surface temperature (top) of 130° C., a surface temperature (bottom) of 130° C., a surface temperature difference of 0° C., and a radius of curvature of the die of 25 mm. As a result, the external appearance was good, and the radius of curvature of the test piece was 29 mm.

Example 16

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organophosphorus compound, and 4.0% by weight of photoinitiator were put into a container, and an adhesive composition was prepared in accordance with the "method for preparing an adhesive" described above. The obtained adhesive composition was used for an electromagnetic wave shield layer of the copper compound thin film mesh (PC film; thickness: 200 μm) and a protecting layer (PC sheet; thickness: 3.0 mm) to produce a sample in accordance with the "method for producing an optically transparent electromagnetic wave shield laminate using an optically transparent adhesive" described above.

Various evaluations were performed in substantially the same manner as in Example 12. In the electromagnetic wave shield performance test, the sample exhibited a good electromagnetic wave shield performance. In the adhesive force test, the sample had an adhesive force of 115 N. The bendability test was performed under the conditions of a surface temperature (top) of 135° C., a surface temperature (bottom) of 135° C., a surface temperature difference of 0° C., and a radius of curvature of the die of 25 mm. As a result, the external appearance was good, and the radius of curvature of the test piece was 27 mm.

Example 17

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organophosphorus compound, and 4.0% by weight of photoinitiator were put into a container, and an adhesive composition was prepared in accordance with the "method for preparing an adhesive" described above. The obtained adhesive composition was used for an electromagnetic wave shield layer of the copper compound thin film mesh (PC film; thickness: 200 μm) and a protecting layer (PC sheet; thickness: 3.0 mm) to produce a sample in accordance with the "method for producing an optically transparent electromagnetic wave shield laminate using an optically transparent adhesive" described above.

Various evaluations were performed in substantially the same manner as in Example 12. In the electromagnetic wave shield performance test, the sample exhibited a good electromagnetic wave shield performance. In the adhesive force test, the sample had an adhesive force of 115 N. The bendability test was performed under the conditions of a surface temperature (top) of 150° C., a surface temperature (bottom) of 150° C., a surface temperature difference of 0° C., and a radius of curvature of the die of 25 mm. As a result, the external appearance was good, and the radius of curvature of the test piece was 25 mm.

Example 18

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organophosphorus compound, and 4.0% by weight of photoinitiator were put into a container, and an adhesive composition was prepared in accordance with the "method for preparing an adhesive" described above. The obtained adhesive composition was used for an electromagnetic wave shield layer of the copper compound thin film mesh (PC film; thickness: 200 μm) and a protecting layer (PC sheet; thickness: 3.0 mm) to produce a sample in accordance with the "method for producing an optically transparent electromagnetic wave shield laminate using an optically transparent adhesive" described above.

Various evaluations were performed in substantially the same manner as in Example 12. In the electromagnetic wave shield performance test, the sample exhibited a good electromagnetic wave shield performance. In the adhesive force test, the sample had an adhesive force of 115 N. The bendability test was performed under the conditions of a surface temperature (top) of 165° C., a surface temperature (bottom) of 165° C., a surface temperature difference of 0° C., and a radius of curvature of the die of 25 mm. As a result, the external appearance was good, and the radius of curvature of the test piece was 25 mm.

Example 19

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organophosphorus compound, and 4.0% by weight of photoinitiator were put into a container, and an adhesive composition was prepared in accordance with the "method for preparing an adhesive" described above. The obtained adhesive composition was used for an electromagnetic wave shield layer of the copper compound thin film mesh (PC film; thickness: 200 μm) and a protecting layer (PC sheet; thickness: 3.0 mm) to produce a sample in accordance with the "method for producing an optically transparent electromagnetic wave shield laminate using an optically transparent adhesive" described above.

Various evaluations were performed in substantially the same manner as in Example 12. In the electromagnetic wave shield performance test, the sample exhibited a good electromagnetic wave shield performance. In the adhesive force test, the sample had an adhesive force of 115 N. The bendability test was performed under the conditions of a surface temperature (top) of 180° C., a surface temperature (bottom) of 180° C., a surface temperature difference of 0° C., and a radius of curvature of the die of 25 mm. As a result, the external appearance was good, and the radius of curvature of the test piece was 25 mm.

Example 20

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organophosphorus compound, and 4.0% by weight of photoinitiator were put into a container, and an adhesive composition was prepared in accordance with the "method for preparing an adhesive" described above. The obtained adhesive composition was used for an electromagnetic wave shield layer of the copper compound thin film mesh (PC film; thickness: 200 μm) and a protecting layer (PC sheet; thickness: 3.0 mm) to produce a sample in accordance with the "method for producing an optically transparent electromagnetic wave shield laminate using an optically transparent adhesive" described above.

Various evaluations were performed in substantially the same manner as in Example 12. In the electromagnetic wave shield performance test, the sample exhibited a good electromagnetic wave shield performance. In the adhesive force test, the sample had an adhesive force of 115 N. The bendability test was performed under the conditions of a surface temperature (top) of 180° C., a surface temperature (bottom) of 160° C., a surface temperature difference of 20° C., and a radius of curvature of the die of 25 mm. As a result, the external appearance was good, and the radius of curvature of the test piece was 25 mm.

Example 21

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organophosphorus compound, and 4.0% by weight of photoinitiator were put into a container, and an adhesive composition was prepared in accordance with the "method for preparing an adhesive" described above. The obtained adhesive composition was used for an electromagnetic wave shield layer of the copper compound thin film mesh (PC film; thickness: 200 μm) and a protecting layer (PC sheet; thickness: 3.0 mm) to produce a sample in accordance with the "method for producing an optically transparent electromagnetic wave shield laminate using an optically transparent adhesive" described above.

Various evaluations were performed in substantially the same manner as in Example 12. In the electromagnetic wave shield performance test, the sample exhibited a good electromagnetic wave shield performance. In the adhesive force test, the sample had an adhesive force of 115 N. The bendability test was performed under the conditions of a surface temperature (top) of 170° C., a surface temperature (bottom) of 160° C., a surface temperature difference of 10° C., and a radius of curvature of the die of 25 mm. As a result, the external appearance was good, and the radius of curvature of the test piece was 25 mm.

Example 22

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organophosphorus compound, and 4.0% by weight of photoinitiator were put into a container, and an adhesive composition was prepared in accordance with the "method for preparing an adhesive" described above. The obtained adhesive composition was used for an electromagnetic wave shield layer of the copper compound thin film mesh (PC film; thickness: 100 μm) and a protecting layer (PC film; thickness: 100 μm) to produce a sample in accordance with the "method for producing an optically transparent electromagnetic wave shield laminate using an optically transparent adhesive" described above.

Various evaluations were performed in substantially the same manner as in Example 12. In the electromagnetic wave shield performance test, the sample exhibited a good electromagnetic wave shield performance. In the adhesive force test, the sample had an adhesive force of 96 N. The bendability test was performed under the conditions of a surface temperature (top) of 165° C., a surface temperature (bottom) of 165° C., a surface temperature difference of 0° C., and a radius of curvature of the die of 25 mm. As a result, the external appearance was good, and the radius of curvature of the test piece was 25 mm.

Example 23

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organophosphorus compound, and 4.0% by weight of photoinitiator were put into a container, and an adhesive composition was prepared in accordance with the "method for preparing an adhesive" described above. The obtained adhesive composition was used for an electromagnetic wave shield layer of the copper compound thin film mesh (PC film; thickness: 200 μm) and a protecting layer (PC sheet; thickness: 10.0 mm) to produce a sample in accordance with the "method for producing an optically transparent electromagnetic wave shield laminate using an optically transparent adhesive" described above.

Various evaluations were performed in substantially the same manner as in Example 12. In the electromagnetic wave shield performance test, the sample exhibited a good electromagnetic wave shield performance. In the adhesive force test, the sample had an adhesive force of 110 N. The bendability test was performed under the conditions of a surface temperature (top) of 165° C., a surface temperature (bottom) of 165° C., a surface temperature difference of 0° C., and a radius of curvature of the die of 50 mm. As a result, the external appearance was good, and the radius of curvature of the test piece was 51 mm.

Example 24

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organophosphorus compound, and 4.0% by weight of photoinitiator were put into a container, and an adhesive composition was prepared in accordance with the "method for preparing an adhesive" described above. The obtained adhesive composition was used for an electromagnetic wave shield layer of the copper compound thin film mesh (PC film; thickness: 200 μm) and a protecting layer (PC sheet; thickness: 20.0 mm) to produce a sample in accordance with the "method for producing an optically transparent electromagnetic wave shield laminate using an optically transparent adhesive" described above.

Various evaluations were performed in substantially the same manner as in Example 12. In the electromagnetic wave shield performance test, the sample exhibited a good electromagnetic wave shield performance. In the adhesive force test, the sample had an adhesive force of 112 N. The bendability test was performed under the conditions of a surface temperature (top) of 165° C., a surface temperature (bottom) of 165° C., a surface temperature difference of 0° C., and a radius of curvature of the die of 100 mm. As a result, the external appearance was good, and the radius of curvature of the test piece was 105 mm.

Example 25

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organophosphorus compound, and 4.0% by weight of photoinitiator were put into a container, and an adhesive composition was prepared in accordance with the "method for preparing an adhesive" described above. The obtained adhesive composition was used for an electromagnetic wave shield layer of the copper compound thin film mesh (PC film; thickness: 200 μm) and a protecting layer (PC sheet; thickness: 3.0 mm) to produce a sample in accordance with the "method for producing an optically transparent electromagnetic wave shield laminate using an optically transparent adhesive" described above.

Various evaluations were performed in substantially the same manner as in Example 12. In the electromagnetic wave shield performance test, the sample exhibited a good electromagnetic wave shield performance. In the adhesive force test, the sample had an adhesive force of 115 N. The bendability test was performed under the conditions of a surface temperature (top) of 165° C., a surface temperature (bottom) of 165° C., a surface temperature difference of 0° C., and a radius of curvature of the die of 10 mm. As a result, the external appearance was good, and the radius of curvature of the test piece was 11 mm.

Example 26

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organophosphorus compound, and 4.0% by weight of photoinitiator were put into a container, and an adhesive composition was prepared in accordance with the "method for preparing an adhesive" described above. The obtained adhesive composition was used for an electromagnetic wave shield layer of the copper compound thin film mesh (PC film; thickness: 200 μm) and protecting layers (PC sheet; thickness: 1.5 mm each) provided above and below the copper compound thin film mesh to produce a sample in accordance with the "method for producing an optically transparent electromagnetic wave shield laminate using an optically transparent adhesive" described above.

Various evaluations were performed in substantially the same manner as in Example 12. In the electromagnetic wave shield performance test, the sample exhibited a good electromagnetic wave shield performance. In the adhesive force test, the sample had an adhesive force of 100 N. The bendability test was performed under the conditions of a surface temperature (top) of 165° C., a surface temperature (bottom) of 165° C., a surface temperature difference of 0° C., and a radius of curvature of the die of 25 mm. As a result, the external appearance was good, and the radius of curvature of the test piece was 26 mm.

Example 27

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organophosphorus compound, and 4.0% by weight of photoinitiator were put into a container, and an adhesive composition was prepared in accordance with the "method for preparing an adhesive" described above. The obtained adhesive composition was used for an electromagnetic wave shield layer of the silver compound thin film mesh (PC film; thickness: 200 μm) and a protecting layer (PC sheet; thickness: 3.0 mm) to produce a sample in accordance with the "method for producing an optically transparent electromagnetic wave shield laminate using an optically transparent adhesive" described above.

Various evaluations were performed in substantially the same manner as in Example 12. In the electromagnetic wave shield performance test, the sample exhibited a good electromagnetic wave shield performance. In the adhesive force test, the sample had an adhesive force of 79 N. The bendability test was performed under the conditions of a surface temperature (top) of 165° C., a surface temperature (bottom) of 165° C., a surface temperature difference of 0° C., and a radius of curvature of the die of 25 mm. As a result, the external appearance was good, and the radius of curvature of the test piece was 25 mm.

Example 28

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organophosphorus compound, and 4.0% by weight of photoinitiator were put into a container, and an adhesive composition was prepared in accordance with the "method for preparing an adhesive" described above. The obtained adhesive composition was used for an electromagnetic wave shield layer of the AgC conductive printed mesh (PC film; thickness: 200 μm) and a protecting layer (PC sheet; thickness: 3.0 mm) to produce a sample in accordance with the "method for producing an optically transparent electromagnetic wave shield laminate using an optically transparent adhesive" described above.

Various evaluations were performed in substantially the same manner as in Example 12. In the electromagnetic wave shield performance test, the sample exhibited a good electromagnetic wave shield performance. In the adhesive force test, the sample had an adhesive force of 120 N. The bendability test was performed under the conditions of a surface temperature (top) of 165° C., a surface temperature (bottom) of 165° C., a surface temperature difference of 0° C., and a radius of curvature of the die of 25 mm. As a result, the external appearance was good, and the radius of curvature of the test piece was 25 mm.

Comparative Example 11

41.1% by weight of urethane (meth)acrylate-based polymerizable oligomer, 54.9% by weight of (meth)acrylate-based polymerizable monomer, and 4.0% by weight of photoinitiator were put into a container, and an adhesive composition was prepared in accordance with the "method for preparing an adhesive" described above. The obtained adhesive composition was used for an electromagnetic wave shield layer of the copper compound thin film mesh (PC film; thickness: 200 μm) and a protecting layer (PC sheet; thickness: 3.0 mm) to produce a sample in accordance with the "method for producing an optically transparent electromagnetic wave shield laminate using an optically transparent adhesive" described above.

Various evaluations were performed in substantially the same manner as in Example 12. In the electromagnetic wave shield performance test, the sample exhibited a good electromagnetic wave shield performance. In the adhesive force test, the sample had an adhesive force of 1 N. The bendability test was performed under the conditions of a surface temperature (top) of 165° C., a surface temperature (bottom) of 165° C., a surface temperature difference of 0° C., and a radius of curvature of the die of 25 mm. As a result, peel-off occurred.

Comparative Example 12

An ethylene vinyl acetate (EVA)-based hotmelt-type adhesive was sandwiched between an electromagnetic wave shield layer of the copper compound thin film mesh (PC film; thickness: 200 μm) and a protecting layer (PC sheet; thickness: 3.0 mm) to produce a sample in accordance with the "method for producing an optically transparent electromagnetic wave shield laminate using a hotmelt-type adhesive" described above.

Various evaluations were performed in substantially the same manner as in Example 12. In the electromagnetic wave shield performance test, the sample exhibited a good electromagnetic wave shield performance. In the adhesive force test, the sample had an adhesive force of 7 N. The bendability test was performed under the conditions of a surface temperature (top) of 165° C., a surface temperature (bottom) of 165° C., a surface temperature difference of 0° C., and a radius of curvature of the die of 25 mm. As a result, the adhesive layer was air-bubbled, and peel-off occurred.

Comparative Example 13

A polyamide-based hotmelt-type adhesive was sandwiched between an electromagnetic wave shield layer of the copper compound thin film mesh (PC film; thickness: 200 μm) and a protecting layer (PC sheet; thickness: 3.0 mm) to produce a sample in accordance with the "method for producing an optically transparent electromagnetic wave shield laminate using a hotmelt-type adhesive" described above.

Various evaluations were performed in substantially the same manner as in Example 12. In the electromagnetic wave shield performance test, the sample exhibited a good electromagnetic wave shield performance. In the adhesive force test, the sample had an adhesive force of 2 N. The bendability test was performed under the conditions of a surface temperature (top) of 165° C., a surface temperature (bottom) of 165° C., a surface temperature difference of 0° C., and a radius of curvature of the die of 25 mm. As a result, peel-off occurred.

Comparative Example 14

A polyurethane-based hotmelt-type adhesive was sandwiched between an electromagnetic wave shield layer of the copper compound thin film mesh (PC film; thickness: 200 μm) and a protecting layer (PC sheet; thickness: 3.0 mm) to produce a sample in accordance with the "method for producing an optically transparent electromagnetic wave shield laminate using a hotmelt-type adhesive" described above.

Various evaluations were performed in substantially the same manner as in Example 12. In the electromagnetic wave shield performance test, the sample exhibited a good electromagnetic wave shield performance. In the adhesive force test, the sample had an adhesive force of 92 N. The bendability test was performed under the conditions of a surface temperature (top) of 165° C., a surface temperature (bottom) of 165° C., a surface temperature difference of 0° C., and a radius of curvature of the die of 25 mm. As a result, the adhesive layer was whitened and the visibility was lost.

Comparative Example 15

A polyester-based hotmelt-type adhesive was sandwiched between an electromagnetic wave shield layer of the copper compound thin film mesh (PC film; thickness: 200 μm) and a protecting layer (PC sheet; thickness: 3.0 mm) to produce a sample in accordance with the "method for producing an optically transparent electromagnetic wave shield laminate using a hotmelt-type adhesive" described above.

Various evaluations were performed in substantially the same manner as in Example 12. In the electromagnetic wave shield performance test, the sample exhibited a good electromagnetic wave shield performance. In the adhesive force test, the sample had an adhesive force of 107 N. The bendability test was performed under the conditions of a surface temperature (top) of 165° C., a surface temperature (bottom) of 165° C., a surface temperature difference of 0° C., and a radius of curvature of the die of 25 mm. As a result, the adhesive layer was foamed, and peel-off occurred.

Comparative Example 16

A polyolefin-based hotmelt-type adhesive was sandwiched between an electromagnetic wave shield layer of the copper compound thin film mesh (PC film; thickness: 200 μm) and a protecting layer (PC sheet; thickness: 3.0 mm) to produce a sample in accordance with the "method for producing an optically transparent electromagnetic wave shield laminate using a hotmelt-type adhesive" described above.

Various evaluations were performed in substantially the same manner as in Example 12. In the electromagnetic wave shield performance test, the sample exhibited a good electromagnetic wave shield performance. In the adhesive force test, the sample had an adhesive force of 3 N. The bendability test was performed under the conditions of a surface temperature (top) of 165° C., a surface temperature (bottom) of 165° C., a surface temperature difference of 0° C., and a radius of curvature of the die of 25 mm. As a result, peel-off occurred.

Comparative Example 17

An acrylic-based pressure-sensitive adhesive sheet was sandwiched between an electromagnetic wave shield layer of the copper compound thin film mesh (PC film; thickness: 200 μm) and a protecting layer (PC sheet; thickness: 3.0 mm) to produce a sample in accordance with the "method for producing an optically transparent electromagnetic wave shield laminate using a pressure-sensitive adhesive" described above.

Various evaluations were performed in substantially the same manner as in Example 12. In the electromagnetic wave shield performance test, the sample exhibited a good electromagnetic wave shield performance. In the adhesive force test, the sample had an adhesive force of 6 N. The bendability test was performed under the conditions of a surface temperature (top) of 165° C., a surface temperature (bottom) of 165° C., a surface temperature difference of 0° C., and a radius of curvature of the die of 25 mm. As a result, the adhesive layer was foamed, and peel-off occurred.

Comparative Example 18

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organophosphorus compound, and 4.0% by weight of photoinitiator were put into a container, and an adhesive composition was prepared in accordance with the "method for preparing an adhesive" described above. The obtained adhesive composition was used for an electromagnetic wave shield layer of the copper compound thin film mesh (PC film; thickness: 200 μm) and a protecting layer (PC sheet; thickness: 3.0 mm) to produce a sample in accordance with the "method for producing an optically transparent electromagnetic wave shield laminate using an optically transparent adhesive" described above.

Various evaluations were performed in substantially the same manner as in Example 12. In the electromagnetic wave shield performance test, the sample exhibited a good electromagnetic wave shield performance. In the adhesive force test, the sample had an adhesive force of 115 N. The bendability test was performed under the conditions of a surface temperature (top) of 125° C., a surface temperature (bottom) of 125° C., a surface temperature difference of 0° C., and a radius of curvature of the die of 25 mm. As a result, the external appearance was good, but the radius of curvature of the test piece was 45 mm.

Comparative Example 19

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organophosphorus compound, and 4.0% by weight of photoinitiator were put into a container, and an adhesive composition was prepared in accordance with the "method for preparing an adhesive" described above. The obtained adhesive composition was used for an electromagnetic wave shield layer of the copper compound thin film mesh (PC film; thickness: 200 μm) and a protecting layer (PC sheet; thickness: 3.0 mm) to produce a sample in accordance with the "method for producing an optically transparent electromagnetic wave shield laminate using an optically transparent adhesive" described above.

Various evaluations were performed in substantially the same manner as in Example 12. In the electromagnetic wave shield performance test, the sample exhibited a good electromagnetic wave shield performance. In the adhesive force test, the sample had an adhesive force of 115 N. The bendability test was performed under the conditions of a surface temperature (top) of 190° C., a surface temperature (bottom) of 190° C., a surface temperature difference of 25° C., and a radius of curvature of the die of 25 mm. As a result, the adhesive layer became wave-shaped, and the radius of curvature of the test piece was 25 mm.

Comparative Example 20

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organophosphorus compound, and 4.0% by weight of photoinitiator were put into a container, and an adhesive composition was prepared in accordance with the "method for preparing an adhesive" described above. The obtained adhesive composition was used for an electromagnetic wave shield layer of the copper compound thin film mesh (PC film; thickness: 200 μm) and a protecting layer (PC sheet; thickness: 3.0 mm) to produce a sample in accordance with the "method for producing an optically transparent electromagnetic wave shield laminate using an optically transparent adhesive" described above.

Various evaluations were performed in substantially the same manner as in Example 12. In the electromagnetic wave shield performance test, the sample exhibited a good electromagnetic wave shield performance. In the adhesive force test, the sample had an adhesive force of 115 N. The bendability test was performed under the conditions of a surface temperature (top) of 165° C., a surface temperature (bottom) of 140° C., a surface temperature difference of 25° C., and a radius of curvature of the die of 25 mm. As a result, the external shape was warped, and the radius of curvature of the test piece was 25 mm.

Comparative Example 21

30.0% by weight of urethane (meth)acrylate-based polymerizable oligomer, 40.0% by weight of (meth)acrylate-based polymerizable monomer, 20.0% by weight of acrylamide derivative, 5.0% by weight of silane compound, 1.0% by weight of organophosphorus compound, and 4.0% by weight of photoinitiator were put into a container, and an adhesive composition was prepared in accordance with the "method for preparing an adhesive" described above. The obtained adhesive composition was used for an electromagnetic wave shield layer of the copper compound thin film mesh (PC film; thickness: 200 μm) and a protecting layer (PC sheet; thickness: 3.0 mm) to produce a sample in accordance with the "method for producing an optically transparent electromagnetic wave shield laminate using an optically transparent adhesive" described above.

Various evaluations were performed in substantially the same manner as in Example 12. In the electromagnetic wave shield performance test, the sample exhibited a good electromagnetic wave shield performance. In the adhesive force test, the sample had an adhesive force of 115 N. The bendability test was performed under the conditions of a surface temperature (top) of 165° C., a surface temperature (bottom) of 130° C., a surface temperature difference of 35° C., and a radius of curvature of the die of 25 mm. As a result, the external shape was warped, and peel-off occurred.

TABLE 3

| | Adhesive type | | (Meth)acrylate adhesive composition [% by weight] | | | | | |
|---|---|---|---|---|---|---|---|---|
| | Curing method | Main component | Urethane (meth)acrylate polymerizable oligomer | (Meth)acrylate polymerizable monomer | Acrylamide derivative | Silane compound | Organo-phosphorus compound | Photo-initiator |
| Ex. 12 | Photocurable adhesive | Acrylic-based | 30.0 | 40.0 | 20.0 | 5.0 | 1.0 | 4.0 |
| Ex. 13 | Photocurable adhesive | Acrylic-based | 30.4 | 40.6 | 20.0 | 5.0 | | 4.0 |
| Ex. 14 | Photocurable adhesive | Acrylic-based | 32.1 | 42.9 | 20.0 | | 1.0 | 4.0 |
| Ex. 15 | Photocurable adhesive | Acrylic-based | 30.0 | 40.0 | 20.0 | 5.0 | 1.0 | 4.0 |
| Ex. 16 | Photocurable adhesive | Acrylic-based | 30.0 | 40.0 | 20.0 | 5.0 | 1.0 | 4.0 |
| Ex. 17 | Photocurable adhesive | Acrylic-based | 30.0 | 40.0 | 20.0 | 5.0 | 1.0 | 4.0 |
| Ex. 18 | Photocurable adhesive | Acrylic-based | 30.0 | 40.0 | 20.0 | 5.0 | 1.0 | 4.0 |
| Ex. 19 | Photocurable adhesive | Acrylic-based | 30.0 | 40.0 | 20.0 | 5.0 | 1.0 | 4.0 |
| Ex. 20 | Photocurable adhesive | Acrylic-based | 30.0 | 40.0 | 20.0 | 5.0 | 1.0 | 4.0 |
| Ex. 21 | Photocurable adhesive | Acrylic-based | 30.0 | 40.0 | 20.0 | 5.0 | 1.0 | 4.0 |
| Ex. 22 | Photocurable adhesive | Acrylic-based | 30.0 | 40.0 | 20.0 | 5.0 | 1.0 | 4.0 |
| Ex. 23 | Photocurable adhesive | Acrylic based | 30.0 | 40.0 | 20.0 | 5.0 | 1.0 | 4.0 |
| Ex. 24 | Photocurable adhesive | Acrylic-based | 30.0 | 40.0 | 20.0 | 5.0 | 1.0 | 4.0 |
| Ex. 25 | Photocurable adhesive | Acrylic-based | 30.0 | 40.0 | 20.0 | 5.0 | 1.0 | 4.0 |
| Ex. 26 | Photocurable adhesive | Acrylic-based | 30.0 | 40.0 | 20.0 | 5.0 | 1.0 | 4.0 |
| Ex. 27 | Photocurable adhesive | Acrylic-based | 30.0 | 40.0 | 20.0 | 5.0 | 1.0 | 4.0 |
| Ex. 28 | Photocurable adhesive | Acrylic-based | 30.0 | 40.0 | 20.0 | 5.0 | 1.0 | 4.0 |

| | Optically transparent electromagnetic wave shield laminate structure | | | |
|---|---|---|---|---|
| | Film or sheet substrate (thickness[mm]) | | | |
| | Top protecting layer | Shield layer | Bottom protecting layer | Conductive compound |
| Ex. 12 | PC (3.0) | PC (0.2) | | Copper compound |
| Ex. 13 | PC (3.0) | PC (0.2) | | Copper compound |

TABLE 3-continued

| | | | | |
|---|---|---|---|---|
| Ex. 14 | PC (3.0) | PC (0.2) | | Copper compound |
| Ex. 15 | PC (3.0) | PC (0.2) | | Copper compound |
| Ex. 16 | PC (3.0) | PC (0.2) | | Copper compound |
| Ex. 17 | PC (3.0) | PC (0.2) | | Copper compound |
| Ex. 18 | PC (3.0) | PC (0.2) | | Copper compound |
| Ex. 19 | PC (3.0) | PC (0.2) | | Copper compound |
| Ex. 20 | PC (3.0) | PC (0.2) | | Copper compound |
| Ex. 21 | PC (3.0) | PC (0.2) | | Copper compound |
| Ex. 22 | PC (0.1) | PC (0.1) | | Copper compound |
| Ex. 23 | PC (10.0) | PC (0.2) | | Copper compound |
| Ex. 24 | PC (20.0) | PC (0.2) | | Copper compound |
| Ex. 25 | PC (3.0) | PC (0.2) | | Copper compound |
| Ex. 26 | PC (1.5) | PC (0.2) | PC (1.5) | Copper compound |
| Ex. 27 | PC (3.0) | PC (0.2) | | Silver compound |
| Ex. 28 | PC (3.0 ) | PC (0.2) | | AgC paste |

TABLE 4

| | Adhesive type | | (Meth)acrylate adhesive composition [% by weight] | | | | | |
|---|---|---|---|---|---|---|---|---|
| | Curing method | Main component | Urethane (meth)acrylate polymerizable oligomer | (Meth)acrylate polymerizable monomer | Acrylamide derivative | Silane compound | Organo-phosphorus compound | Photo-initiator |
| Comparative ex. 11 | Photocurable adhesive | Acrylic-based | 41.1 | 54.9 | | | | 4.0 |
| Comparative ex. 12 | Hot melt-type adhesive | EVA-based | | | | | | |
| Comparative ex. 13 | Hot melt-type adhesive | Polyamide-based | | | | | | |
| Comparative ex. 14 | Hot melt-type adhesive | Polyurethane-based | | | | | | |
| Comparative ex. 15 | Hot melt-type adhesive | Polyester-based | | | | | | |
| Comparative ex. 16 | Hot melt-type adhesive | Polyolefin-based | | | | | | |
| Comparative ex. 17 | Pressure-sensitive adhesive | Acrylic-based | | | | | | |
| Comparative ex. 18 | Photocurable adhesive | Acrylic-based | 30.0 | 40.0 | 20.0 | 5.0 | 1.0 | 4.0 |
| Comparative ex. 19 | Photocurable adhesive | Acrylic-based | 30.0 | 40.0 | 20.0 | 5.0 | 1.0 | 4.0 |
| Comparative ex. 20 | Photocurable adhesive | Acrylic-based | 30.0 | 40.0 | 20.0 | 5.0 | 1.0 | 4.0 |
| Comparative ex. 21 | Photocurable adhesive | Acrylic-based | 30.0 | 40.0 | 20.0 | 5.0 | 1.0 | 4.0 |

| | Optically transparent electromagnetic wave shield laminate structure | | | |
|---|---|---|---|---|
| | Film or sheet substrate (thickness[mm]) | | | |
| | Top protecting layer | Shield layer | Bottom protecting layer | Conductive compound |
| Comparative ex. 11 | PC (3.0) | PC (0.2) | | Copper compound |
| Comparative ex. 12 | PC (3.0) | PC (0.2) | | Copper compound |

TABLE 4-continued

| | | | |
|---|---|---|---|
| Comparative ex. 13 | PC (3.0) | PC (0.2) | Copper compound |
| Comparative ex. 14 | PC (3.0) | PC (0.2) | Copper compound |
| Comparative ex. 15 | PC (3.0) | PC (0.2) | Copper compound |
| Comparative ex. 16 | PC (3.0) | PC (0.2) | Copper compound |
| Comparative ex. 17 | PC (3.0) | PC (0.2) | Copper compound |
| Comparative ex. 18 | PC (3.0) | PC (0.2) | Copper compound |
| Comparative ex. 19 | PC (3.0) | PC (0.2) | Copper compound |
| Comparative ex. 20 | PC (3.0) | PC (0.2) | Copper compound |
| Comparative ex. 21 | PC (3.0) | PC (0.2) | Copper compound |

TABLE 5

| | Adhesive type | | Bending conditions | | | | Electromagnetic wave shield performance test OK/Not OK | Adhesive force test T-peel strength test [N/25 mm] |
|---|---|---|---|---|---|---|---|---|
| | Curing method | Main component | Heating temperature [° C.] | | | Radius of curvature of die [mm] | | |
| | | | Top surface temperature | Bottom surface temperature | Surface temperature difference | | | |
| Ex. 12 | Photocurable adhesive | Acrylic-based | 165 | 165 | 0 | 25 | ○ | 115 |
| Ex. 13 | Photocurable adhesive | Acrylic-based | 165 | 165 | 0 | 25 | ○ | 70 |
| Ex. 14 | Photocurable adhesive | Acrylic-based | 165 | 165 | 0 | 25 | ○ | 86 |
| Ex. 15 | Photocurable adhesive | Acrylic-based | 130 | 130 | 0 | 25 | ○ | 115 |
| Ex. 16 | Photocurable adhesive | Acrylic-based | 135 | 135 | 0 | 25 | ○ | 115 |
| Ex. 17 | Photocurable adhesive | Acrylic-based | 150 | 150 | 0 | 25 | ○ | 115 |
| Ex. 18 | Photocurable adhesive | Acrylic-based | 165 | 165 | 0 | 25 | ○ | 115 |
| Ex. 19 | Photocurable adhesive | Acrylic-based | 180 | 180 | 0 | 25 | ○ | 115 |
| Ex. 20 | Photocurable adhesive | Acrylic-based | 180 | 160 | 20 | 25 | ○ | 115 |
| Ex. 21 | Photocurable adhesive | Acrylic-based | 170 | 160 | 10 | 25 | ○ | 115 |
| Ex. 22 | Photocurable adhesive | Acrylic-based | 165 | 165 | 0 | 25 | ○ | 96 |
| Ex. 23 | Photocurable adhesive | Acrylic-based | 165 | 165 | 0 | 50 | ○ | 110 |
| Ex. 24 | Photocurable adhesive | Acrylic-based | 165 | 165 | 0 | 100 | ○ | 112 |
| Ex. 25 | Photocurable adhesive | Acrylic-based | 165 | 165 | 0 | 10 | ○ | 115 |
| Ex. 26 | Photocurable adhesive | Acrylic-based | 165 | 165 | 0 | 25 | ○ | 100 |
| Ex. 27 | Photocurable adhesive | Acrylic-based | 165 | 165 | 0 | 25 | ○ | 79 |
| Ex. 28 | Photocurable adhesive | Acrylic-based | 165 | 165 | 0 | 25 | ○ | 120 |

| | Bendability test | |
|---|---|---|
| | External appearance | Radius of curvature of test piece [mm] |
| Ex. 12 | ○ | 25(○) |
| Ex. 13 | ○ | 25(○) |
| Ex. 14 | ○ | 25(○) |
| Ex. 15 | ○ | 29(△) |
| Ex. 16 | ○ | 27(○) |
| Ex. 17 | ○ | 25(○) |
| Ex. 18 | ○ | 25(○) |
| Ex. 19 | ○ | 25(○) |
| Ex. 20 | ○ | 25(○) |
| Ex. 21 | ○ | 25(○) |
| Ex. 22 | ○ | 25(○) |
| Ex. 23 | ○ | 51(○) |
| Ex. 24 | ○ | 105(○) |
| Ex. 25 | ○ | 11(○) |
| Ex. 26 | ○ | 26(○) |
| Ex. 27 | ○ | 25(○) |
| Ex. 28 | ○ | 25(○) |

TABLE 6

| | Adhesive type | | Bending conditions | | | | Electromagnetic wave shield performance test OK/Not OK | Adhesive force test T-peel strength test [N/25 mm] |
|---|---|---|---|---|---|---|---|---|
| | | | Heating temperature [° C.] | | | | | |
| | Curing method | Main component | Top surface temperature | Bottom surface temperature | Surface temperature difference | Radius of curvature of die [mm] | | |
| Comparative ex. 11 | Photocurable adhesive | Acrylic-based | 165 | 165 | 0 | 25 | ○ | 1 |
| Comparative ex. 12 | Hot melt-type adhesive | EVA-based | 165 | 165 | 0 | 25 | ○ | 7 |
| Comparative ex. 13 | Hot melt-type adhesive | Polyamide-based | 165 | 165 | 0 | 25 | ○ | 2 |
| Comparative ex. 14 | Hot melt-type adhesive | Polyurethane-based | 165 | 165 | 0 | 25 | ○ | 92 |
| Comparative ex. 15 | Hot melt-type adhesive | Polyester-based | 165 | 165 | 0 | 25 | ○ | 107 |
| Comparative ex. 16 | Hot melt-type adhesive | Polyolefin-based | 165 | 165 | 0 | 25 | ○ | 3 |
| Comparative ex. 17 | Pressure-sensitive adhesive | Acrylic-based | 165 | 165 | 0 | 25 | ○ | 6 |
| Comparative ex. 18 | Photocurable adhesive | Acrylic-based | 125 | 125 | 0 | 25 | ○ | 115 |
| Comparative ex. 19 | Photocurable adhesive | Acrylic-based | 190 | 190 | 0 | 25 | ○ | 115 |
| Comparative ex. 20 | Photocurable adhesive | Acrylic-based | 165 | 140 | 25 | 25 | ○ | 115 |
| Comparative ex. 21 | Photocurable adhesive | Acrylic-based | 165 | 130 | 35 | 25 | ○ | 115 |

| | Bendability test | |
|---|---|---|
| | External appearance | Radius of curvature of test piece [mm] |
| Comparative ex. 11 | X peeled off | Unmeasureable (X) |
| Comparative ex. 12 | X peeled off/foamed | Unmeasureable (X) |
| Comparative ex. 13 | X peeled off | Unmeasureable (X) |
| Comparative ex. 14 | X whitened | 26(○) |
| Comparative ex. 15 | X peeled off/ foamed | Unmeasureable (X) |
| Comparative ex. 16 | X peeled off | Unmeasureable (X) |
| Comparative ex. 17 | X peeled off/foamed | Unmeasureable (X) |
| Comparative ex. 18 | ○ | 45(X) |
| Comparative ex. 19 | X wave-shaped | 25(○) |
| Comparative ex. 20 | X warped | 25(○) |
| Comparative ex. 21 | X warped/peeled off | Unmeasureable (X) |

The invention claimed is:

1. A method for manufacturing a laminate, comprising the steps of:
    laminating two or more layers of polycarbonate resin film and/or sheet using a (meth)acrylate-based adhesive composition containing a (A) (meth)acrylate monomer, a (B) meth(acrylate) oligomer, an (C) acrylamide derivative, and a (D) silane compound and/or an (E) organophosphorus compound to form a laminate having a thickness of 0.1 mm to 30 mm;
    heating the laminate at 130° C. to 185° C. so that a temperature difference between a top surface and a bottom surface of the laminate is not more than 20° C.; and
    bending the laminate after heating into a curved shape having a radius of curvature of 10 mm or greater.

2. The method for manufacturing a laminate according to claim 1, wherein the step of heating the laminate comprises heating the laminate at 150° C. to 185° C.

3. The method for manufacturing a laminate according to claim 1, wherein one of the two or more layers of polycarbonate resin film and/or sheet is an electromagnetic wave shield layer, and at least one of the two or more layers is a protecting layer.

4. The method for manufacturing a laminate according to claim 3, wherein the electromagnetic wave shield layer contains a conductive compound containing at least one metal component selected from the group consisting of silver, copper, aluminum, nickel, carbon, ITO (indium oxide/tin oxide), ZnO, tin, zinc, titanium, tungsten and stainless steel.

5. The method for manufacturing a laminate according to claim 3, wherein the electromagnetic wave shield layer has an electromagnetic wave shield performance of 30 decibel or greater.

6. The method for manufacturing a laminate according to claim 3, wherein the electromagnetic wave shield layer contains at least one selected from the group consisting of a metal thin film mesh, a metal woven mesh, a conductive fiber mesh, and a conductive printed mesh.

7. The method for manufacturing a laminate according to claim 6, wherein the metal thin film mesh and the conductive printed mesh have a base substrate containing a polycarbonate resin, a polyethylene terephthalate resin, or a polyester resin.

8. The method for manufacturing a laminate according to claim 1, wherein the laminate has a 180 degree peel strength of 50 N/25 mm width or greater.

9. The method for manufacturing a laminate according to claim 1, wherein the laminate is not peeled or clouded after being treated for 200 hours under conditions of 65° C. and 95 RH %.

10. The method for manufacturing a laminate according to claim 1, wherein the (B) (meth)acrylate oligomer is at least one (meth)acrylate oligomer selected from the group consisting of urethane (meth)acrylate oligomer, polyester (meth) acrylate oligomer, epoxy (meth)acrylate oligomer, and polyol (meth)acrylate oligomer.

11. The method for manufacturing a laminate according to claim 10, wherein the urethane (meth)acrylate oligomer is an alicyclic hydrocarbon compound.

12. The method for manufacturing a laminate according to claim 11, wherein the urethane (meth)acrylate oligomer, which is the alicyclic hydrocarbon compound, is a compound derived from dicyclohexylmethaneisocyanate.

13. The method for manufacturing a laminate according to claim 1, wherein the (C) acrylamide derivative is alkyl acrylamide and/or alkyl methacrylamide.

14. The method for manufacturing a laminate according to claim 1, wherein the (C) acrylamide derivative is at least one selected from the group consisting of dimethyl acrylamide, isopropyl acrylamide, diethyl acrylamide, and 4-acrylomorpholine.

15. The method for manufacturing a laminate according to claim 1, wherein the (D) silane compound is at least one selected from the group consisting of amino-functional silane, epoxy-functional silane, vinyl-functional silane, mercapto-functional silane, methacrylate-functional silane, acrylamide-functional silane, and acrylate-functional silane.

16. The method for manufacturing a laminate according to claim 1, wherein the (D) silane compound is (3-(2,3-epoxypropoxy)propyl)trimethoxysilane.

17. The method for manufacturing a laminate according to claim 1, wherein the (E) organophosphorus compound is an acrylate phosphate compound.

18. The method for manufacturing a laminate according to claim 1, wherein the meth(acrylate)-based adhesive composition is a non-solvent (meth)acrylate-based adhesive composition.

19. The method for manufacturing a laminate according to claim 1, wherein the (meth)acrylate-based adhesive composition is a photocurable (meth)acrylate-based adhesive composition which is curable by visible light, an ultraviolet ray (UV) or an electron beam (EB).

20. The method for manufacturing a laminate according to claim 1, comprising the step of forming a cover film containing at least one selected from the group consisting of an antioxidant, an ultraviolet absorber and a photostabilizer on one or both of the surfaces of the laminate.

21. The method for manufacturing a laminate according to claim 20, wherein the cover film contains a thermosetting resin or a photocurable resin.

22. The method for manufacturing a laminate according to claim 20, wherein the cover film contains an acrylic-based resin compound or a silicone-based resin compound.

23. The method for manufacturing a laminate according to claim 1, wherein the layers containing the polycarbonate resin or the layers containing the (meth)acrylate-based adhesive composition contain at least one selected from the group consisting of an antioxidant, an ultraviolet absorber and a photostabilizer.

* * * * *